(12) United States Patent
Nishide et al.

(10) Patent No.: US 11,057,551 B2
(45) Date of Patent: Jul. 6, 2021

(54) IMAGE CAPTURING AND DISPLAY APPARATUS AND WEARABLE DEVICE

(71) Applicant: CANON KABUSHIKI KAISHA, Tokyo (JP)

(72) Inventors: Yosuke Nishide, Kawasaki (JP); Yu Maehashi, Yokohama (JP); Masahiro Kobayashi, Tokyo (JP); Katsuyuki Hoshino, Kawasaki (JP); Akira Okita, Yamato (JP); Takeshi Ichikawa, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/365,952

(22) Filed: Mar. 27, 2019

(65) Prior Publication Data
US 2019/0222733 A1 Jul. 18, 2019

Related U.S. Application Data

(63) Continuation of application No. PCT/JP2017/028860, filed on Aug. 9, 2017.

(30) Foreign Application Priority Data

Oct. 7, 2016 (JP) .............................. JP2016-199410

(51) Int. Cl.
*H04N 5/222* (2006.01)
*H04N 5/225* (2006.01)
(Continued)

(52) U.S. Cl.
CPC ........... *H04N 5/2257* (2013.01); *G06F 1/163* (2013.01); *G09F 9/30* (2013.01); *H01L 27/14* (2013.01);
(Continued)

(58) Field of Classification Search
CPC .. H04N 5/2252; H04N 5/2253; H04N 5/2254; H04N 5/2256; H04N 5/2257;
(Continued)

(56) References Cited

U.S. PATENT DOCUMENTS 7,460,162 B2 12/2008 Koizumi et al.
7,538,810 B2 5/2009 Koizumi et al.
(Continued)

FOREIGN PATENT DOCUMENTS

JP S59-019369 A 1/1984
JP H01-106467 A 4/1989
(Continued)

OTHER PUBLICATIONS

International Search Report and Written Opinion dated Aug. 9, 2017, in PCT/JP2017/028860.
(Continued)

*Primary Examiner* — Kelly L Jerabek
(74) *Attorney, Agent, or Firm* — Venable LLP

(57) ABSTRACT

An image capturing and display apparatus comprises a plurality of photoelectric conversion elements for converting incident light from the outside of the image capturing and display apparatus to electrical charge signals, and a plurality of light-emitting elements for emitting light of an intensity corresponding to the electrical charge signals acquired by the plurality of photoelectric conversion elements. A pixel region is defined as a region in which the plurality of photoelectric conversion elements are arranged in an array. Signal paths for transmitting signals from the plurality of photoelectric conversion elements to the plurality of light-emitting elements lie within the pixel region.

24 Claims, 14 Drawing Sheets

(51) Int. Cl.

| | |
|---|---|
| *G06F 1/16* | (2006.01) |
| *H01L 31/0216* | (2014.01) |
| *H01L 31/147* | (2006.01) |
| *H01L 31/02* | (2006.01) |
| *H01L 27/146* | (2006.01) |
| *H01L 27/15* | (2006.01) |
| *H01L 27/14* | (2006.01) |
| *H04N 5/369* | (2011.01) |
| *H01L 31/10* | (2006.01) |
| *H05B 33/02* | (2006.01) |
| *G09F 9/30* | (2006.01) |
| *H01L 27/32* | (2006.01) |
| *H05B 33/14* | (2006.01) |
| *H01L 51/50* | (2006.01) |
| *H05B 33/12* | (2006.01) |
| *H01L 27/144* | (2006.01) |

(52) U.S. Cl.
CPC .......... *H01L 27/144* (2013.01); *H01L 27/146* (2013.01); *H01L 27/15* (2013.01); *H01L 27/32* (2013.01); *H01L 31/02019* (2013.01); *H01L 31/02164* (2013.01); *H01L 31/10* (2013.01); *H01L 31/147* (2013.01); *H01L 51/50* (2013.01); *H04N 5/2256* (2013.01); *H04N 5/369* (2013.01); *H05B 33/02* (2013.01); *H05B 33/12* (2013.01); *H05B 33/14* (2013.01)

(58) Field of Classification Search
CPC ... H04N 5/335; G06F 1/163; H01L 27/14612; H01L 27/14623; H01L 31/02164; H01L 31/147; H01L 31/02019; G02B 27/017; G02B 27/0172
See application file for complete search history.

(56) References Cited

U.S. PATENT DOCUMENTS

| | | | |
|---|---|---|---|
| 7,872,286 | B2 | 1/2011 | Okita et al. |
| 8,159,573 | B2 | 4/2012 | Suzuki et al. |
| 9,053,996 | B2 | 6/2015 | Iwane et al. |
| 9,685,560 | B2 | 6/2017 | Yamazaki et al. |
| 9,716,849 | B2 | 7/2017 | Kobayashi et al. |
| 9,948,877 | B2 | 4/2018 | Iwane et al. |
| 10,009,565 | B2 | 6/2018 | Sonoda et al. |
| 2004/0075637 | A1 | 4/2004 | Izumi |
| 2005/0128332 | A1* | 6/2005 | Tsuboi ............... H04N 7/144 348/333.12 |
| 2007/0118482 | A1 | 5/2007 | Tuyls et al. |
| 2009/0009628 | A1* | 1/2009 | Janicek ............... H04N 5/232 348/231.99 |
| 2012/0154656 | A1* | 6/2012 | Oike ............... H04N 5/37452 348/308 |
| 2015/0054734 | A1 | 2/2015 | Raghoebardajal et al. |
| 2015/0244962 | A1* | 8/2015 | Sonoda ............... G01T 1/2018 250/208.1 |
| 2019/0037161 | A1 | 1/2019 | Ikeda et al. |

FOREIGN PATENT DOCUMENTS

| | | |
|---|---|---|
| JP | H08-102924 A | 4/1996 |
| JP | H11-122544 A | 4/1999 |
| JP | 2002-176162 A | 6/2002 |
| JP | 2005-122159 A | 5/2005 |
| JP | 2007-074666 A | 3/2007 |
| JP | 2008-241827 A | 10/2008 |
| JP | 2016-174147 A | 9/2016 |
| WO | 2014/030551 A1 | 2/2014 |
| WO | 2018/066225 A1 | 4/2018 |

OTHER PUBLICATIONS

Search Report dated Apr. 29, 2020, in European Patent Application No. 17858065.0.

* cited by examiner 751  760

751  760

751  760

IMAGE CAPTURING AND DISPLAY APPARATUS AND WEARABLE DEVICE

CROSS-REFERENCE TO RELATED APPLICATIONS

This application is a Continuation of International Patent Application No. PCT/JP2017/028860, filed Aug. 9, 2017, which claims the benefit of Japanese Patent Application No. 2016-199410, filed Oct. 7, 2016, both of which are hereby incorporated by reference herein in their entirety.

BACKGROUND OF THE INVENTION

Field of the Invention

The present invention relates to an image capturing and display apparatus and a wearable device.

Background Art

There is a known wearable device called a head mount display (hereinafter referred to as an HMD) or smart glasses, which is equipped with a display apparatus. According to one method employed by such a wearable device, a scene in front of the user (an external scene) is captured as an image, using an image capturing apparatus, and the image is displayed on the display apparatus. With this method, the user can feel as if the user directly sees the external scene despite the user seeing the scene through the display apparatus. Patent Literature 1 proposes technology for arranging photodiodes and EL (electroluminescence) elements in a matrix on the same substrate in order to downsize such a display apparatus. Specifically, an area sensor in which each pixel has a photodiode and an EL element captures an image of a subject as image signals, using the photodiodes. Thereafter, the area sensor displays the image thus captured, using the EL elements.

CITATION LIST

Patent Literature

PTL1: Japanese Patent Laid-Open No. 2002-176162

In the apparatus according to Patent Literature 1, the same surface serves as a light-receiving surface and a light-emitting surface, and the applicability of this apparatus to another apparatus is limited. For example, it is difficult to apply this apparatus to an HMD or smart glasses. Also, even in the case of an apparatus that is applicable to an HMD or smart glasses, if it takes a long time from when the apparatus captures the scene to when the apparatus displays the scene, the user feels that something is amiss. As a result, it is difficult for the user to catch hold of a moving object, for example. One aspect of the present invention is to provide technology for making it easier to apply an image capturing and display apparatus to another apparatus.

SUMMARY OF INVENTION

In view of the above problems, provided is an image capturing and display apparatus comprising: a plurality of photoelectric conversion elements for converting incident light from the outside of the image capturing and display apparatus to electrical charge signals; and a plurality of light-emitting elements for emitting light of an intensity corresponding to the electrical charge signals acquired by the plurality of photoelectric conversion elements, wherein a pixel region is defined as a region in which the plurality of photoelectric conversion elements are arranged in an array, and signal paths for transmitting signals from the plurality of photoelectric conversion elements to the plurality of light-emitting elements lie within the pixel region.

Further features of the present invention will become apparent from the following description of exemplary embodiments with reference to the attached drawings.

DESCRIPTION OF THE EMBODIMENTS

Figure 1A:
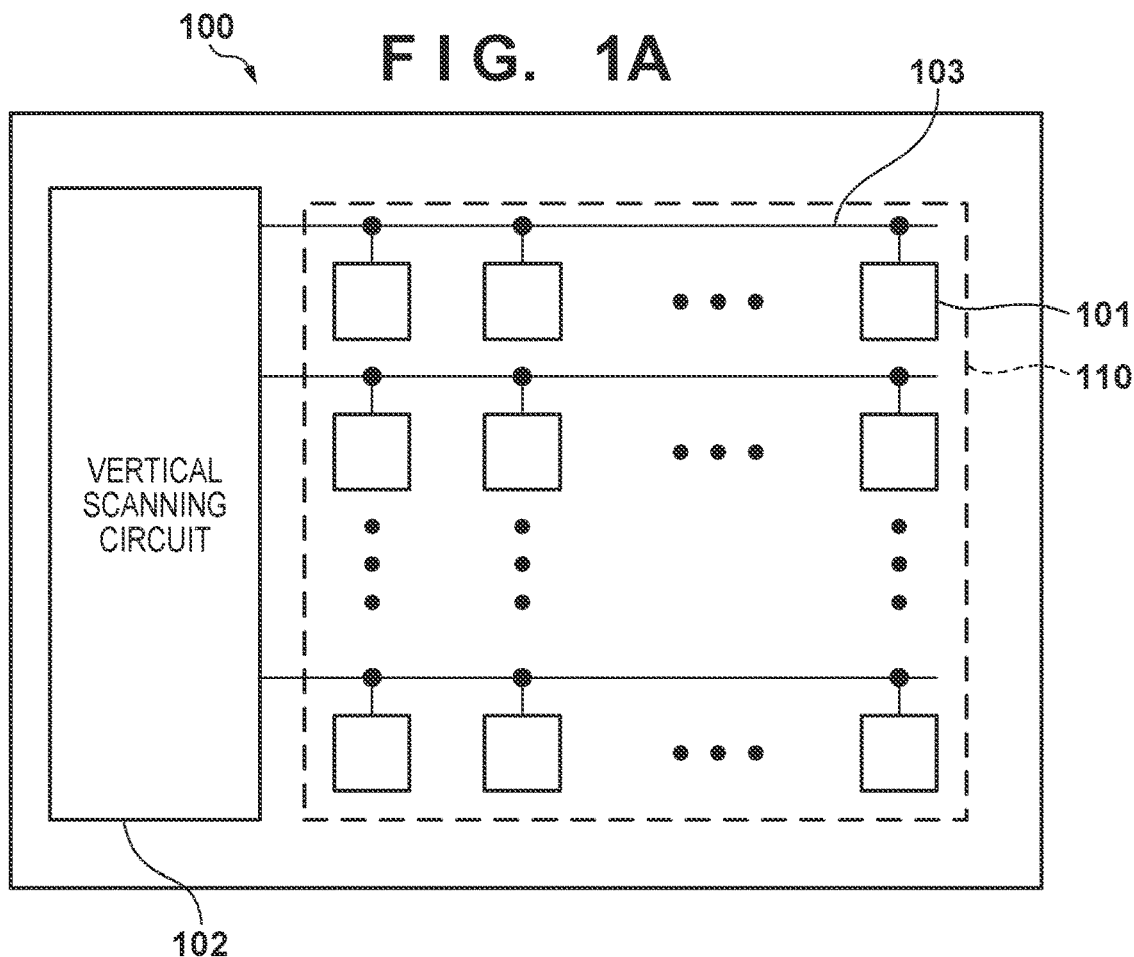
FIG. 1A illustrates an image capturing and display apparatus according to some embodiments.

The following describes embodiments of the present invention with reference to the accompanying drawings. The same components are assigned the same reference numerals throughout various embodiments, and duplicative descriptions are omitted. The embodiments may be modified or combined with each other as appropriate.

Figure 1B:
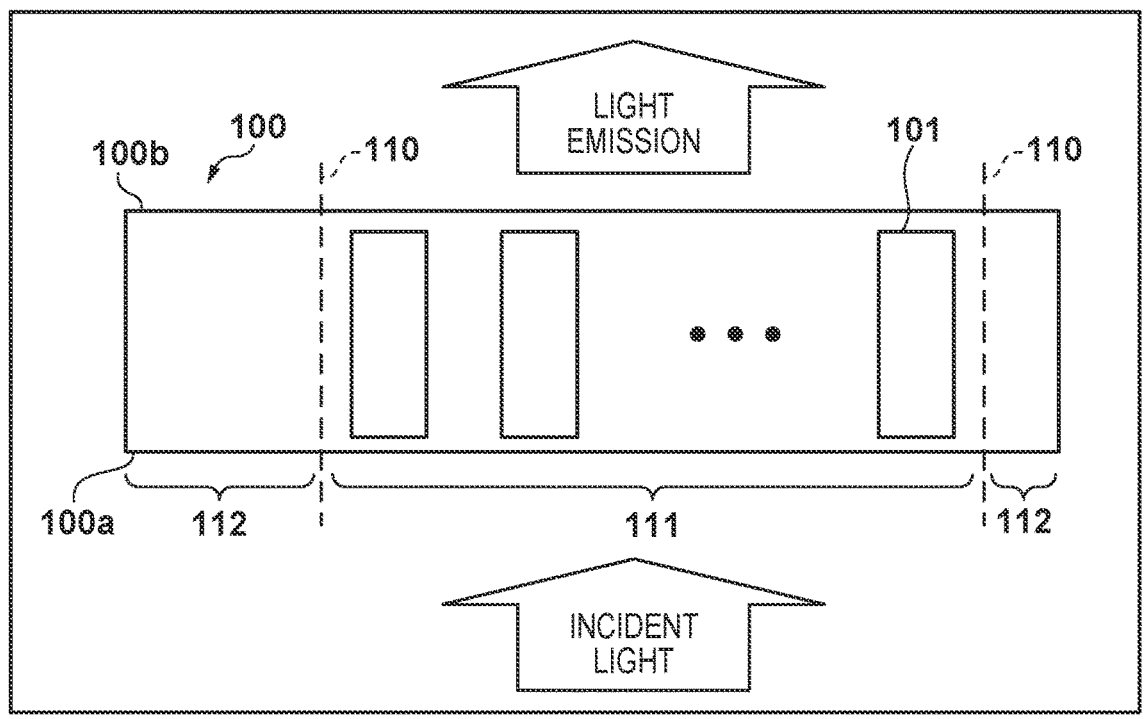
FIG. 1B illustrates an image capturing and display apparatus according to some embodiments.

An example of a configuration of an image capturing and display apparatus 100 according to some embodiments will be described with reference to FIGS. 1A and 1B. FIG. 1A is a plan view of the image capturing and display apparatus 100, and FIG. 1B is a cross-sectional view of the image capturing and display apparatus 100. The image capturing and display apparatus 100 has a pixel region 111 inside a dotted line 110 and a peripheral circuit region 112 outside the dotted line 110. A plurality of pixels 101 are disposed in an array in the pixel region 111. A vertical scanning circuit 102 is disposed in the peripheral circuit region 112. In addition, a power supply circuit (not shown) and so on are also disposed in the peripheral circuit region 112. Conductive lines 103 are each disposed for a plurality of pixels that are lined up in a row direction. The pixels 101 are supplied with control signals from the vertical scanning circuit 102 via the conductive lines 103. In FIG. 1A, one conductive line 103 is shown for each row of pixels. However, if each pixel is to be supplied with a plurality of kinds of control signals, a plurality of conductive lines 103 are respectively disposed for the control signals.

The image capturing and display apparatus 100 has an upper surface 100b and a lower surface 100a that is opposite the upper surface 100b. The upper surface 100b may also be referred to as a top surface, and the lower surface 100a may also be referred to as a back surface or a bottom surface. Each pixel 101 emits, from the upper surface 100b of the image capturing and display apparatus 100, light of an intensity corresponding to the intensity of incident light entering through the lower surface 100a of the image capturing and display apparatus 100. Therefore, the lower surface 100a may also be referred to as an incidence surface, and the upper surface 100b may also be referred to as a light-emitting surface.

Figure 2A:
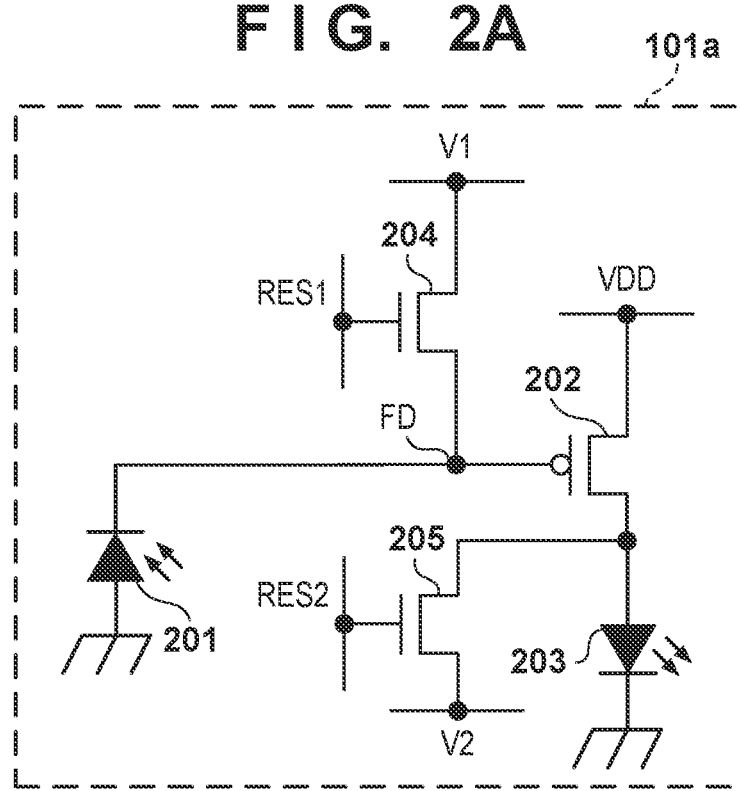
FIG. 2A is an equivalent circuit diagram for a pixel according to some embodiments.

A specific example of the configuration of a pixel 101 will be described with reference to the equivalent circuit diagrams shown in FIGS. 2A to 4B. FIG. 2A shows an equivalent circuit diagram for a pixel 101a, which is one specific example of the pixels 101. The pixel 101a includes a photoelectric conversion element 201, an amplifier transistor 202, a light-emitting element 203, a reset transistor 204, and a reset transistor 205.

One end of the photoelectric conversion element 201 is connected to the gate of the amplifier transistor 202, and the other end is connected to ground. The node between the photoelectric conversion element 201 and the gate of the amplifier transistor 202 functions as a floating diffusion FD. One primary electrode of the amplifier transistor 202 is connected to a power supply line through which a voltage VDD is supplied, and the other primary electrode is connected to the light-emitting element 203. One end of the light-emitting element 203 is connected to the amplifier transistor 202, and the other end is connected to ground. The light-emitting element 203 may be connected to another constant voltage source instead of being connected to ground. The floating diffusion FD is connected to a power supply line through which a voltage V1 is supplied, via the reset transistor 204. The gate of the reset transistor 204 is supplied with a control signal RES1 from the vertical scanning circuit 102. The node between the light-emitting element 203 and the amplifier transistor 202 is connected to a power supply line through which a voltage V2 is supplied, via the reset transistor 205. The gate of the reset transistor 205 is supplied with a control signal RES2 from the vertical scanning circuit 102.

The photoelectric conversion element 201 converts incident light from the outside of the image capturing and display apparatus 100 (from the lower surface 100a in the example shown in FIG. 1B) to an electrical charge signal. The photoelectric conversion element 201 is, for example, a photodiode, an organic photoelectric conversion element, an inorganic photoelectric conversion element, or the like. Examples of the material of the photodiode include silicon, germanium, indium, gallium, arsenic, and so on. Examples of a photoelectric conversion layer include a PN junction type, in which a P-type semiconductor layer and an N-type semiconductor layer are joined to each other, a PIN type, in which a semiconductor layer with a high electrical resistance is sandwiched between a P-type semiconductor layer and a N-type semiconductor layer, an avalanche type, which utilizes avalanche breakdown, and so on. Each pixel 101 in FIG. 1A includes a photoelectric conversion element 201. Therefore, it can be said that the pixel region 111 is defined as a region in which a plurality of photoelectric conversion elements 201 are disposed in an array.

An organic photoelectric conversion element has, for example, a structure in which at least one organic thin film layer (organic photoelectric conversion layer) that performs photoelectric conversion is disposed between a pair of electrodes. An organic photoelectric conversion element may have a structure in which there are a plurality of organic thin film layers between a pair of electrodes. An organic photoelectric conversion layer may be made of a single material or a mix of a plurality of materials. An organic thin film layer may be formed through a vacuum deposition process, a coating process, or the like.

An inorganic photoelectric conversion element is, for example, a quantum dot photoelectric conversion element that uses a quantum dot thin film layer that contains a fine semiconductor crystal, instead of an organic photoelectric conversion layer, a perovskite photoelectric conversion element that includes a photoelectric conversion layer made of a transition metal oxide or the like that has a perovskite structure, instead of an organic photoelectric conversion layer, or the like.

The light-emitting element 203 emits light of an intensity corresponding to an electrical charge signal acquired by the photoelectric conversion element 201. The light-emitting element 203 is, for example, an inorganic LED (light emitting diode), an organic LED (an OLED, an organic light emitting diode, an organic EL, an organic electroluminescent element), or the like. Examples of the material of an inorganic LED include aluminum, gallium, arsenic, phosphorus, indium, nitrogen, selenium, zinc, diamond, a zinc oxide, a perovskite semiconductor, and so on. A pn junction structure formed using these materials emit light with energy (a wavelength) corresponding to the band gap of the materials.

An organic LED includes, for example, a light-emitting layer that contains at least one type of organic light-emitting material between a pair of electrodes. An organic LED may include a plurality of light-emitting layers, and may have a structure in which there are a plurality of organic thin film layers. A light-emitting layer may be made of a single material or a mix of a plurality of materials. Light from a light-emitting layer may be fluorescence or phosphorescence, and may be monochromatic light emission (blue, green, red, etc.) or white light emission. An organic thin film layer may be formed through a vacuum deposition process, a coating process, or the like.

The amplifier transistor 202 constitutes an amplifier circuit that amplifies an electrical charge signal acquired by the photoelectric conversion element 201. The reset transistor 204 resets the voltage across the photoelectric conversion element 201 to the initial state, upon being turned ON. The reset transistor 205 resets the voltage across the light-emitting element 203 to the initial state, upon being turned ON.

Figure 2B:
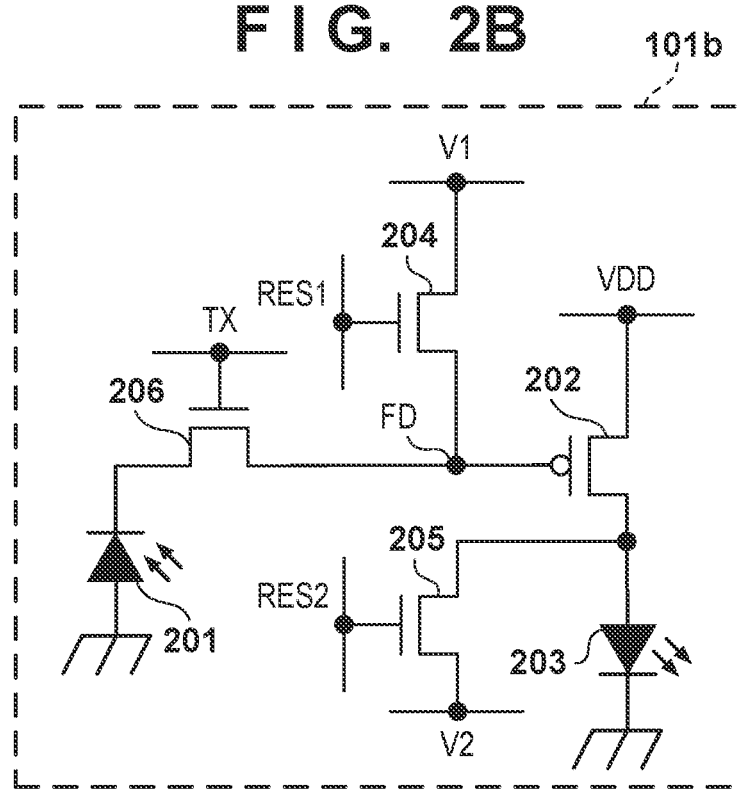
FIG. 2B is an equivalent circuit diagram for a pixel according to some embodiments.

FIG. 2B shows an equivalent circuit diagram for a pixel 101b, which is one specific example of the pixels 101. The pixel 101b is different from the pixel 101a in that the pixel 101b further includes a transfer transistor 206 between the photoelectric conversion element 201 and the amplifier transistor 202, and may be otherwise the same as the pixel 101a. As the transfer transistor 206 is provided, it is possible to mainly reduce noise called kTC noise, which may be generated in the reset transistor 204 due to variations in the reset level. The gate of the transfer transistor 206 is supplied with a control signal TX from the vertical scanning circuit 102. That is, the vertical scanning circuit 102 functions as a driving circuit that generates a control signal TX that switches the transfer transistor 206 to ON and OFF. The node between the transfer transistor 206 and the gate of the amplifier transistor 202 functions as the floating diffusion FD. A signal path used to transmit a signal from the photoelectric conversion element 201 to the light-emitting element 203 may further be provided with a buffer circuit (not shown) between the floating diffusion FD and the amplifier transistor 202. With a buffer circuit, it is possible to suppress the influence of a noise charge that may be generated due to a contact connection between silicon and metal.

Figure 2C:
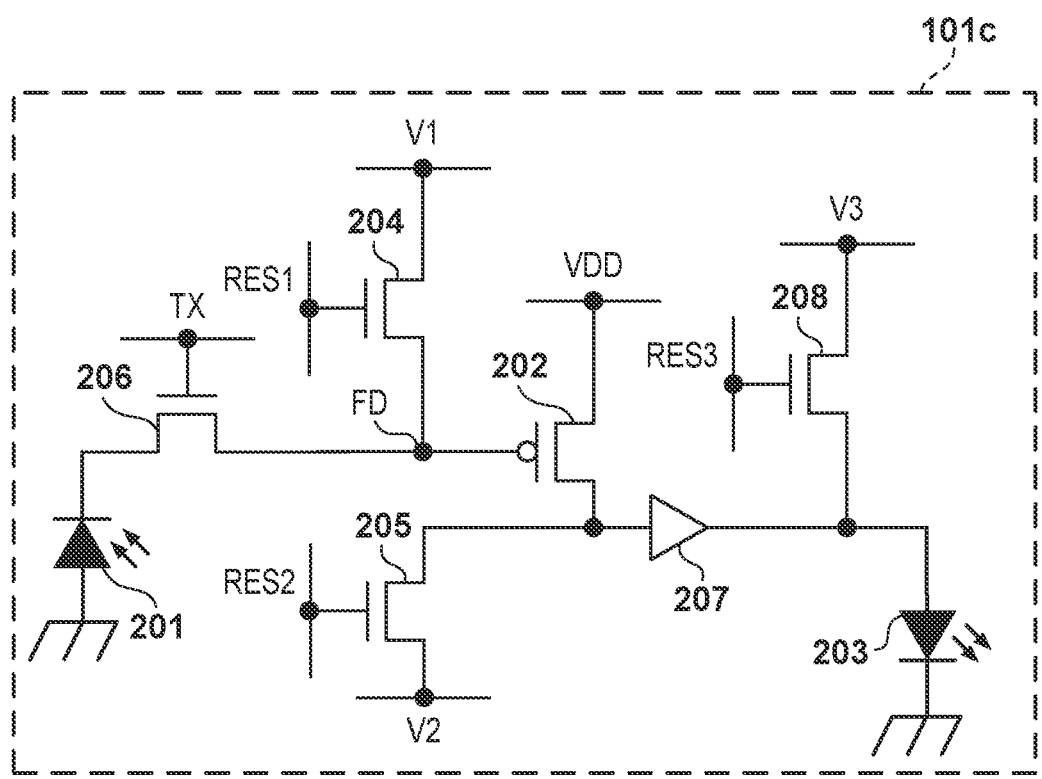
FIG. 2C is an equivalent circuit diagram for a pixel according to some embodiments.

FIG. 2C shows an equivalent circuit diagram for a pixel 101c, which is one specific example of the pixels 101. The pixel 101c is different from the pixel 101b in that the pixel 101c further includes a buffer circuit 207 and a reset transistor 208, and may be otherwise the same as the pixel 101b. One end of the buffer circuit 207 is connected to the amplifier transistor 202, and the other end is connected to the light-emitting element 203. The node between the light-emitting element 203 and the buffer circuit 207 is connected to a power supply line through which a voltage V3 is supplied, via the reset transistor 208. The gate of the reset transistor 208 is supplied with a control signal RES3 from the vertical scanning circuit 102.

The buffer circuit 207 corrects a current (an electrical charge signal) flowing from the amplifier transistor 202 to the light-emitting element 203. The buffer circuit 207 is, for example, a γ correction circuit, a two-dimensional shading correction circuit, a variation correction circuit, a feedback reset circuit, or the like.

Figure 3A:
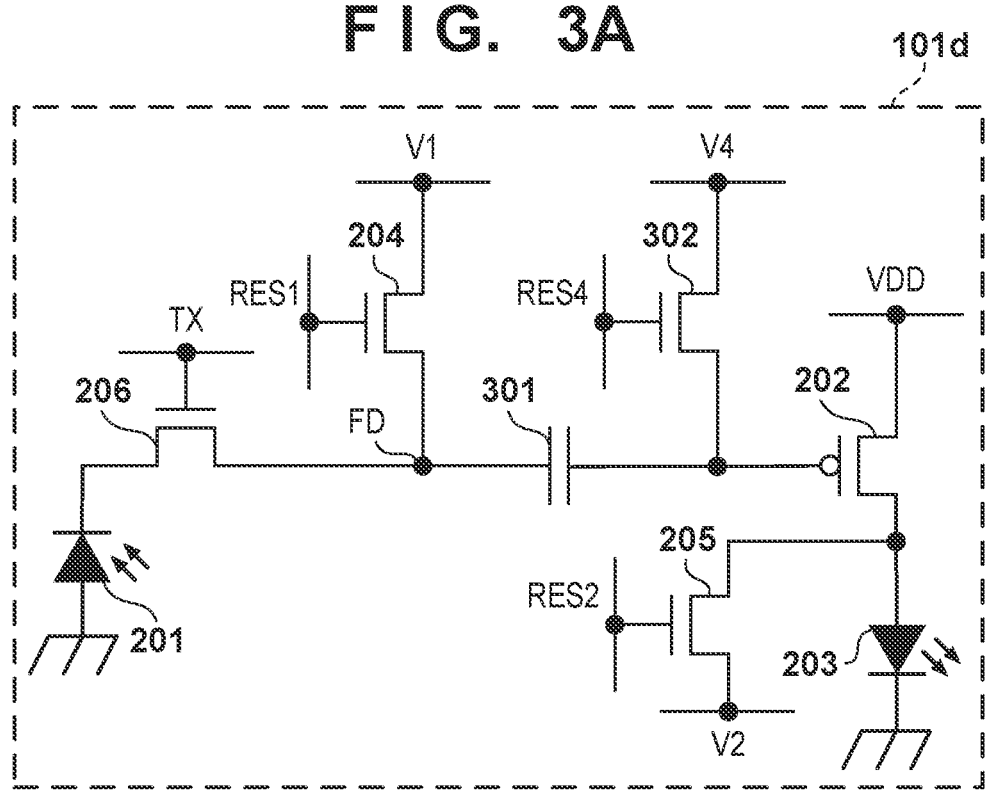
FIG. 3A is an equivalent circuit diagram for a pixel according to some embodiments.

FIG. 3A shows an equivalent circuit diagram for a pixel 101d, which is one specific example of the pixels 101. The pixel 101d is different from the pixel 101b in that the pixel 101d further includes a capacitor element 301 and a reset transistor 302, and may be otherwise the same as the pixel 101b. The capacitor element 301 is connected between the transfer transistor 206 and the amplifier transistor 202. The node between the transfer transistor 206 and the capacitor element 301 functions as the floating diffusion FD. The node between the capacitor element 301 and the amplifier transistor 202 is connected to a power supply line that supplies a voltage V4, via the reset transistor 302. The gate of the reset transistor 302 is supplied with a control signal RES4 from the vertical scanning circuit 102. As the capacitor element 301 is provided, it is possible to supply the amplifier transistor 202 with, as a signal, a change in the voltage across the capacitor element 301 caused by an electrical charge transferred to the floating diffusion FD. As a result, it is possible to set the power supply voltage of the photoelectric conversion element 201 and the power supply voltage of the light-emitting element 203 so as to be independent of each other.

Figure 3B:
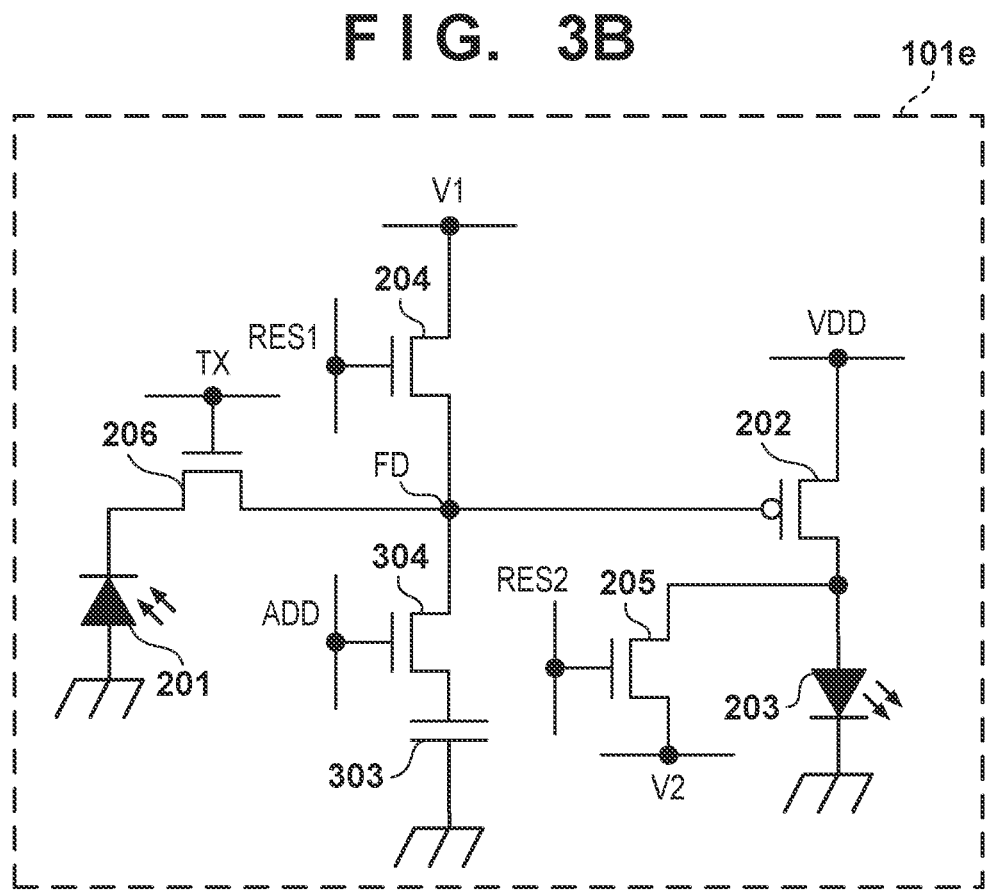
FIG. 3B is an equivalent circuit diagram for a pixel according to some embodiments.

FIG. 3B shows an equivalent circuit diagram for a pixel 101e, which is one specific example of the pixels 101. The pixel 101e is different from the pixel 101b in that the pixel 101e further includes a capacitor element 303 and a capacitance adding transistor 304, and may be otherwise the same as the pixel 101b. One end of the capacitor element 303 is connected to the capacitance adding transistor 304, and the other end is connected to ground. The capacitance adding transistor 304 is connected between the capacitor element 303 and the floating diffusion FD. The gate of the capacitance adding transistor 304 is supplied with a control signal ADD from the vertical scanning circuit 102. Upon the capacitance adding transistor 304 being turned ON, the capacitance of the capacitor element 301 is added to the capacitance of the floating diffusion FD. Thus, the electrical charge signal to be supplied to the light-emitting element 203 is changed.

Figure 4A:
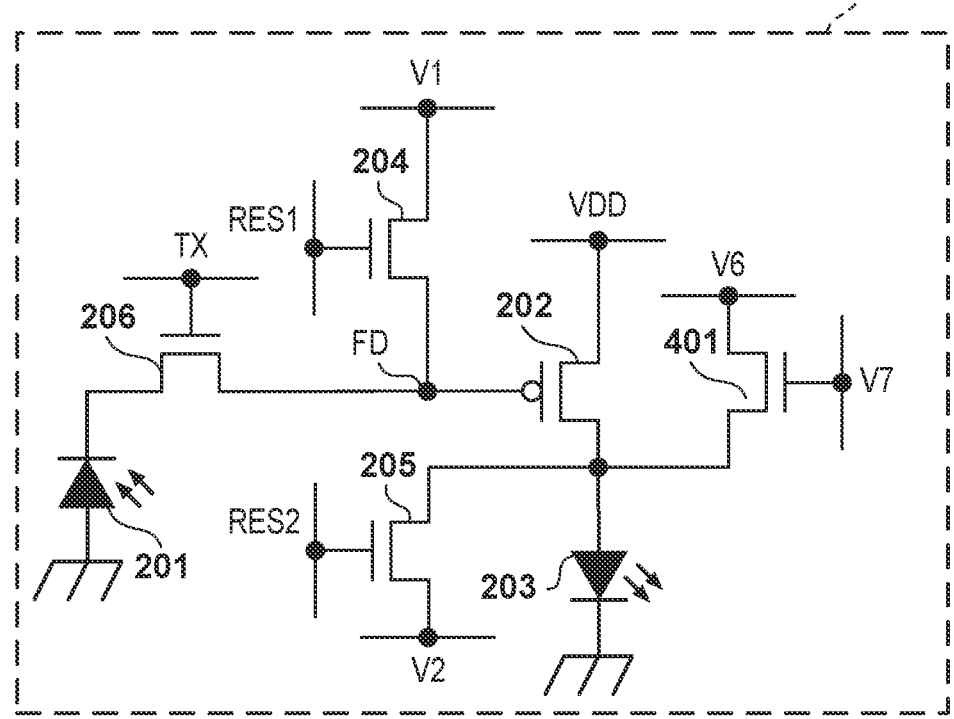
FIG. 4A is an equivalent circuit diagram for a pixel according to some embodiments.

FIG. 4A shows an equivalent circuit diagram for a pixel 101f, which is one specific example of the pixels 101. The pixel 101f is different from the pixel 101b in that the pixel 101f further includes a clip transistor 401, and may be otherwise the same as the pixel 101b. The node between the light-emitting element 203 and the amplifier transistor 202 is connected to a power supply line through which a voltage V6 is supplied, via the clip transistor 401. The gate of the clip transistor 401 is connected to a power supply line through which a voltage V7 is supplied.

If light of an intensity that is significantly higher than the saturation level of the photoelectric conversion element 201 is incident to the image capturing and display apparatus 100, there is the possibility of the voltage level of the floating diffusion FD or the light-emitting element 203 dropping to be lower than a voltage level that allows for normal operation. To suppress such a voltage level drop, the pixel 101f includes a clip circuit. The reset transistor 204 functions as a clip circuit for the floating diffusion FD. Also, the clip transistor 401 functions as a clip circuit for the node between the light-emitting element 203 and the amplifier transistor 202. As the clip transistor 401 is included in the pixel 101f, it is possible to prevent an unexpected voltage from being applied to the light-emitting element 203. In the pixel 101f, a voltage that is applied to the clip transistor 401 is shared in each row or region.

Figure 4B:
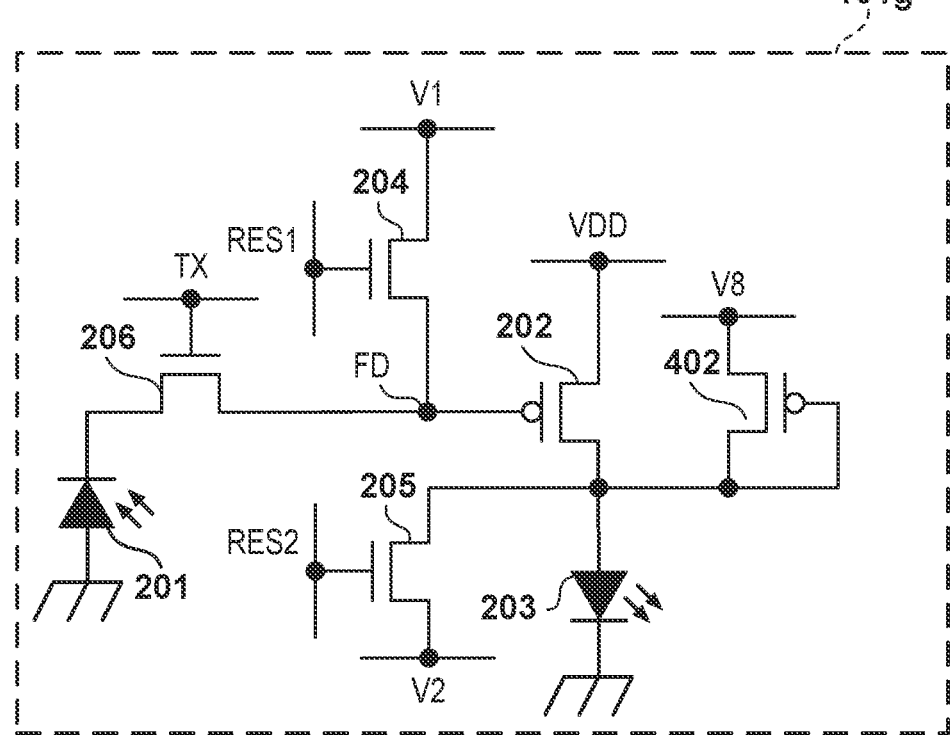
FIG. 4B is an equivalent circuit diagram for a pixel according to some embodiments.

FIG. 4B shows an equivalent circuit diagram for a pixel 101g, which is one specific example of the pixels 101. The pixel 101g is different from the pixel 101b in that the pixel 101g further includes a clip transistor 402, and may be otherwise the same as the pixel 101b. The node between the light-emitting element 203 and the amplifier transistor 202 is connected to a power supply line through which a voltage V8 is supplied, via the clip transistor 402. The clip transistor 402 is connected to the node between the light-emitting element 203 and the amplifier transistor 202. The clip transistor 402 functions as a clip circuit for the node between the light-emitting element 203 and the amplifier transistor 202. In each pixel 101g, a clip operation is performed according to the voltage at the input unit of the light-emitting element 203.

Each of the specific examples of pixels shown in FIGS. 2A to 4B includes the reset transistors 204 and 205 and the amplifier transistor 202. Alternatively, at least one of: the reset transistors 204 and 205; and/or the amplifier transistor 202 may be omitted. The configurations of the pixels are not limited to those shown in FIGS. 2A to 4B, and a circuit element may be added as appropriate, or the configurations may be combined. For example, it is possible to make a modification such as sharing a circuit element between a plurality of light-receiving elements or a plurality of light-emitting elements or providing a selection switch and connecting a circuit element to any of a plurality of elements.

Figure 5A:
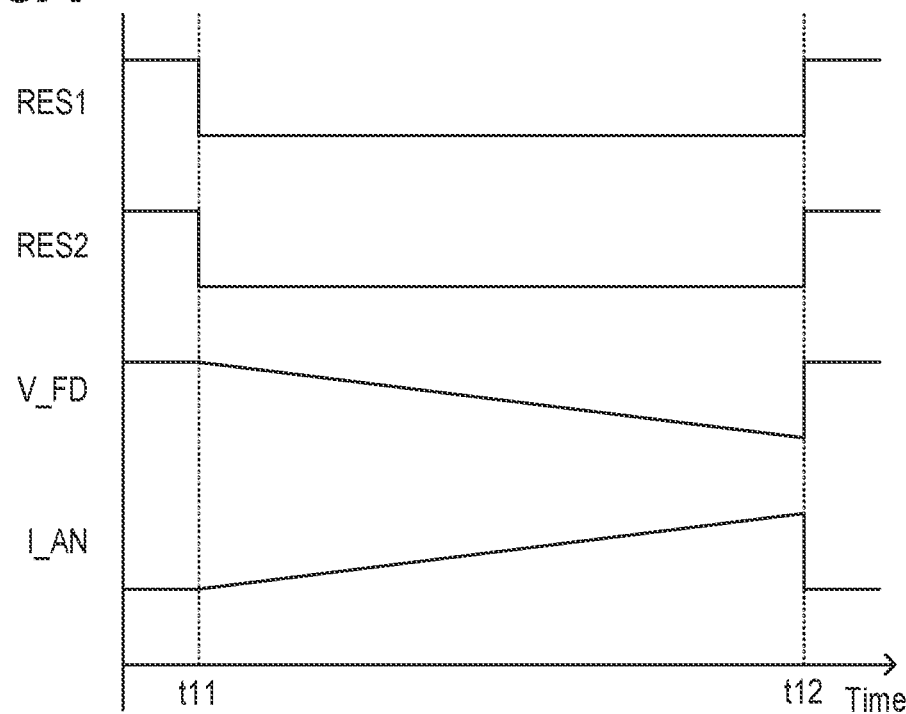
FIG. 5A is a timing chart for an image capturing and display apparatus according to some embodiments.
Figure 5B:
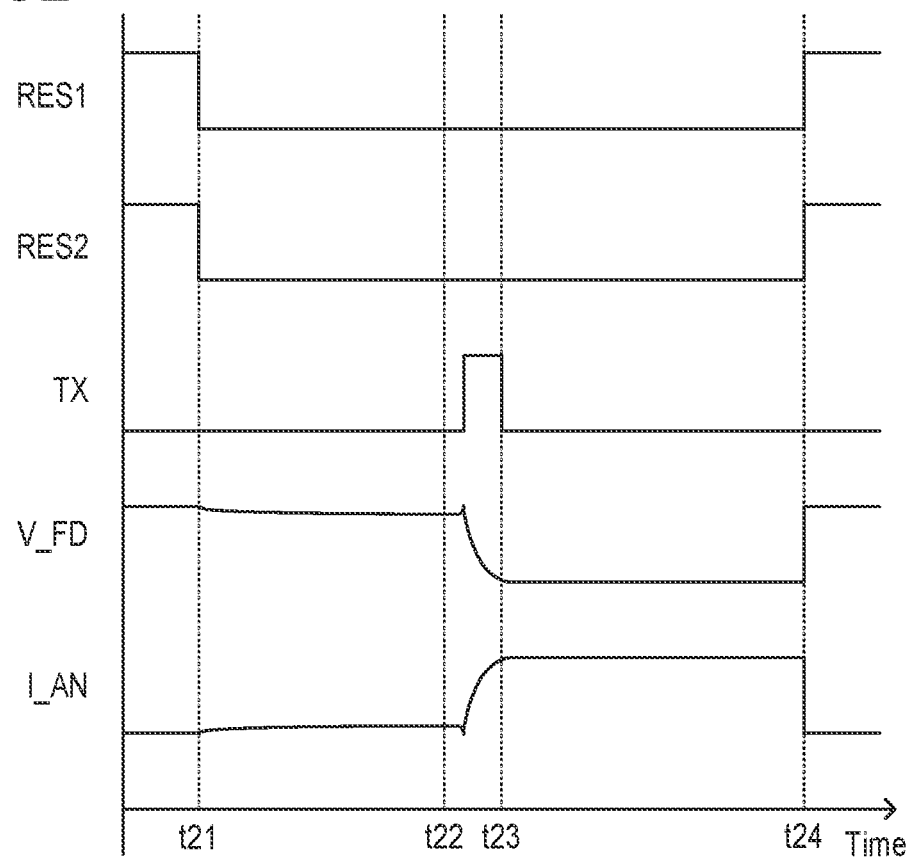
FIG. 5B is a timing chart for an image capturing and display apparatus according to some embodiments.

Next, an example of an example of operations of the image capturing and display apparatus 100 will be described with reference to the timing charts shown in FIGS. 5A and 5B. In FIGS. 5A and 5B, RES1, RES2, and TX denote levels of control signals that are generated by the vertical scanning circuit 102, V_FD denotes the value of a voltage at the floating diffusion FD, and I_AN denotes the value of a current flowing through the light-emitting element 203.

FIG. 5A is a timing chart in the case where the pixels 101 of the image capturing and display apparatus 100 are the pixels 101a. The reset transistor 204 is ON when the control signal RES1 is at the high level, and is OFF when the control signal RES1 is at the low level. The relationship between the reset transistor 205 and the control signal RES2 is the same as above. Before a time point t11, both of the reset transistors 204 and 205 are ON, and therefore the voltage at the floating diffusion FD has been reset to the voltage V1 and the voltage at the node between the amplifier transistor 202 and the light-emitting element 203 has been reset to the voltage V2. The voltage V1 and the voltage V2 may be the same value.

At the time point t11, the vertical scanning circuit 102 switches the control signals RES1 and RES2 from ON to OFF. As a result, the photoelectric conversion element 201 generates an electrical charge signal corresponding to the intensity of incident light. The electrical charge thus generated may be an electron or a hole. The voltage at the floating diffusion FD changes according to the value of the electrical charge signal thus generated. A current corresponding to the amount of change in the voltage at the floating diffusion FD flows between the source and the drain of the amplifier transistor 202. This current is supplied to the light-emitting element 203, and thus the light-emitting element 203 emits light of an intensity corresponding to the amount of current.

Thereafter, at a time point t12, the vertical scanning circuit 102 switches the control signals RES1 and RES2 from OFF to ON. As a result, the voltage at the floating diffusion FD is reset to the voltage V1, and the voltage at the node between the amplifier transistor 202 and the light-emitting element 203 is reset to the voltage V2.

FIG. 5B is a timing chart in the case where the pixels 101 of the image capturing and display apparatus 100 are the pixels 101b. The transfer transistor 206 is ON when the control signal TX is at the high level, and is OFF when the control signal TX is at the low level. Before a time point t21, both of the reset transistors 204 and 205 are ON, and therefore the voltage at the floating diffusion FD has been reset to the voltage V1 and the voltage at the node between the amplifier transistor 202 and the light-emitting element 203 has been reset to the voltage V2. The voltage V1 and the voltage V2 may be the same value.

At the time point t21, the vertical scanning circuit 102 switches the control signals RES1 and RES2 from ON to OFF. As a result, the photoelectric conversion element 201 generates an electrical charge signal corresponding to the intensity of incident light, and stores the electrical charge signal in the photoelectric conversion element 201. Also, the voltage at the floating diffusion FD changes according to noise.

At a time point t22, the vertical scanning circuit 102 switches the control signal TX from OFF to ON. As a result, the electrical charge stored in the photoelectric conversion element 201 is transferred to the floating diffusion FD, and a current corresponding to the amount of change in the voltage at the floating diffusion FD flows between the source and the drain of the amplifier transistor 202. This current is supplied to the light-emitting element 203, and thus the light-emitting element 203 emits light of an intensity corresponding to the amount of current.

At a time point t23, the vertical scanning circuit 102 switches the control signal TX from ON to OFF, and thereafter, at a time point t24, the vertical scanning circuit 102 switches the control signals RES1 and RES2 from OFF to ON. As a result, the resetting operations described with reference to FIG. 5A are performed.

Even if the pixels 101 of the image capturing and display apparatus 100 are any of the pixels 101c to 101g, processing may be performed according to the timing chart shown in FIG. 5B. In such cases, the timing with which the vertical scanning circuit 102 switches the control signals RES3 and RES4 may also be the same as the timing with which the vertical scanning circuit 102 switches the control signals RES1 and RES2. Therefore, the same conductive line may be shared to supply the control signals RES1 to RES4 to one pixel. In other words, the vertical scanning circuit 102 may supply control signals to the respective gates of the reset transistors 204, 205, 208, and 302 through a common conductive line. With this configuration, the number of conductive lines can be reduced, and the flexibility in laying out the pixels can be increased.

The vertical scanning circuit 102 may switch the level of the control signal RES1 that is supplied to the reset transistor 204 of each of the plurality of rows of pixels, at the same time. That is, the vertical scanning circuit 102 may switch the respective reset transistors 204 of the pixels 101 included in the pixel region to ON or OFF all at once, thereby resetting the voltages at the respective floating diffusions FD all at once (at the same time). The same applies to the control signals RES2 to RES4.

Similarly, the vertical scanning circuit 102 may switch the level of the control signal TX that is supplied to the transfer transistor 206 of each of the plurality of rows of pixels, at the same time. That is, the vertical scanning circuit 102 may switch the respective transfer transistors 206 of the pixels 101 included in the pixel region to ON or OFF all at once, thereby transferring the electrical charge signals stored in the respective photoelectric conversion elements 201, all at once (at the same time). Thus, as a result of the vertical scanning circuit 102 driving all of the pixels in the pixel region with the same timing, the refresh rate of the image capturing and display apparatus 100 can be improved.

In any of the above-described pixels 101a to 101g, signal paths for transmitting signals from a plurality of photoelectric conversion elements 201 to a plurality of light-emitting elements 203 lie within the pixel region 111. Therefore, compared to a case where a signal acquired by the photoelectric conversion element 201 is read out of the pixel region, and an image is displayed after data processing is performed on an image acquired from the pixel array, it is possible to shorten the period of time from when light enters the photoelectric conversion element 201 to when the light-emitting element 203 emits light.

Next, an example of the configuration of the pixel 101b will be described with reference to the cross-sectional view shown in FIG. 6. The image capturing and display apparatus 100 includes two substrates 600 and 650 that are stacked on each other. The substrate 600 includes a photoelectric conversion element, and the substrate 650 includes a light-emitting element.

The substrate 600 includes a semiconductor layer 601, an insulation layer 604, a color filter layer 611, and a microlens 612. The semiconductor layer 601 includes a plurality of impurity regions, including impurity regions 602 and 603. The impurity region 602 constitutes the photoelectric conversion element 201. The impurity region 603 functions as the floating diffusion FD. In addition, the plurality of impurity regions also include regions that constitute the reset transistor 204. The color filter layer 611 is in a Bayer arrangement, for example, and breaks incident light up into colors red, green, and blue. Instead of the color filter layer 611, an element that performs photoelectric conversion on red light, an element that performs photoelectric conversion on green light, and an element that performs photoelectric conversion on blue light may be disposed in the pixel region 111.

Electrodes 605 and 606, a conductive pattern 607, plugs 608 and 609, and a connection portion 610 are formed in the insulation layer 604. The electrode 605 functions as the gate of the transfer transistor 206. The electrode 606 functions as the gate of the reset transistor 204. The floating diffusion FD is connected to the connection portion 610 via the plug 608, a portion of the conductive pattern 607, and the plug 609. As described above, the photoelectric conversion element 201 performs photoelectric conversion on incident light entering through the lower surface 100a of the image capturing and display apparatus 100. That is, the substrate 600 is a back side illumination type substrate. Alternatively, the substrate 600 may be formed as a top side illumination type substrate.

The substrate 650 includes a semiconductor layer 651 and an insulation layer 653. The semiconductor layer 651 includes a plurality of impurity regions, including an impurity region 652. The impurity region 652 functions as the node between the amplifier transistor 202 and the light-emitting element 203. The plurality of impurity regions also include regions that constitute the reset transistor 205.

Electrodes 654 and 655, a conductive pattern 656, a plug 658, a light-emitting layer 657, and a connection portion 659 are formed in the insulation layer 653. The light-emitting layer 657 constitutes the light-emitting element 203. A light-emitting layer 657 that emits red light, a light-emitting layer 657 that emits green light, and a light-emitting layer 657 that emits blue light may be disposed in the pixel region 111. Alternatively, the substrate 650 may include a color filter on the light-emitting layer 657, and the color filter may convert white light emitted from the light-emitting layer 657 into the individual colors. The electrode 654 functions as the gate of the amplifier transistor 202. The electrode 655 functions as the gate of the reset transistor 205. A portion of the conductive pattern 656 is connected to the connection portion 659 via the plug 658.

The connection portion 610 and the connection portion 659 may be directly connected to each other, or connected via a micro bump. If the substrates 600 and 650 have a thickness of several hundred micrometers or smaller, a supporting substrate may be attached to each of the substrates 600 and 650 in order to ensure the strength of the image capturing and display apparatus 100. For example, a transparent supporting substrate that is formed using glass, plastic, quartz, or the like may be attached to at least one of the lower side of the substrate 600 and/or the upper side of the substrate 650. The supporting substrate may be attached by using a device layer transfer method. According to this method, for example, the substrate 600 is generated on a base with a porous structure region therebetween, and thereafter the substrate 600 is separated so as to be disposed on the transparent supporting substrate.

Figure 6:
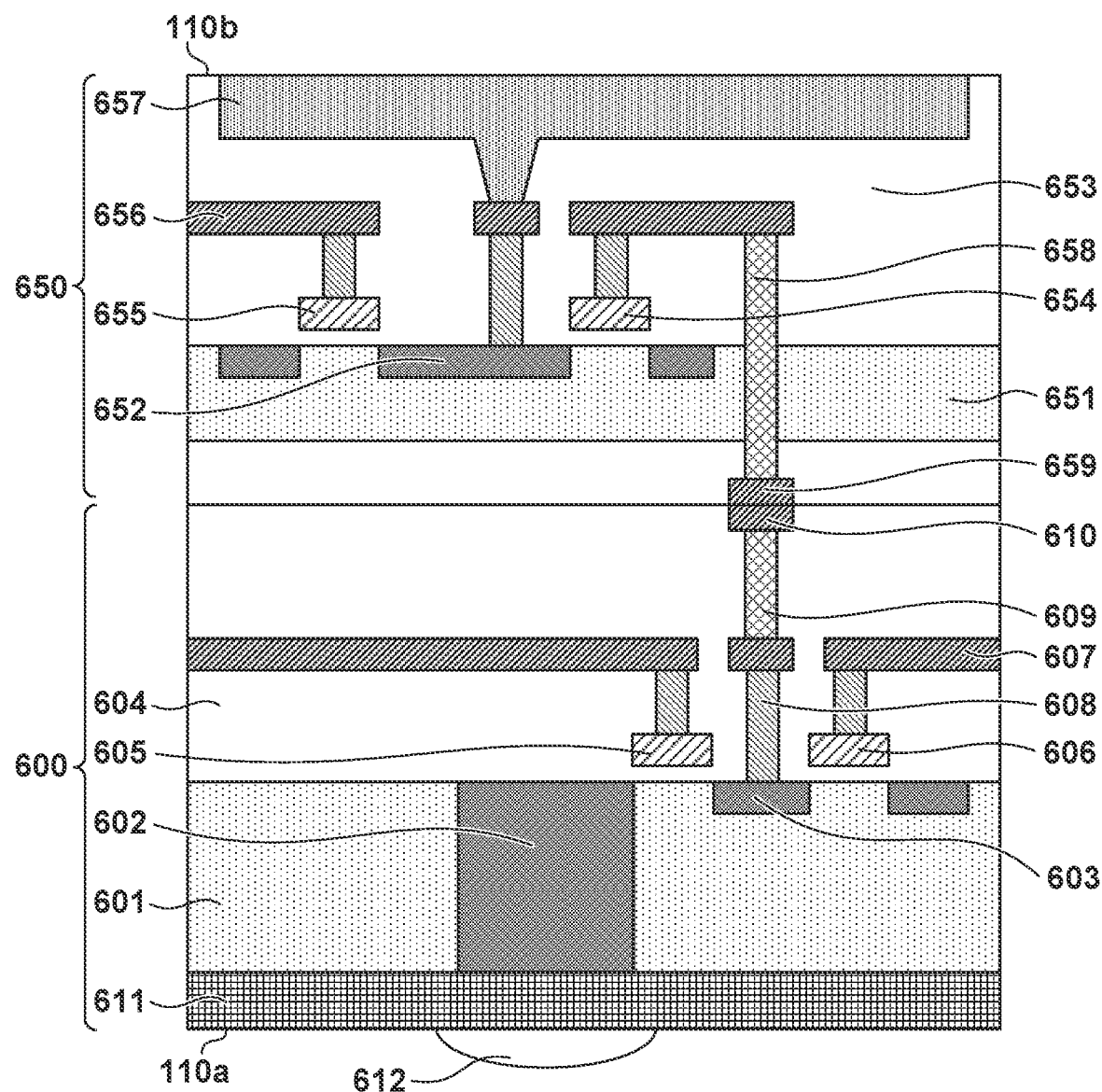
FIG. 6 illustrates a cross-sectional structure of a pixel according to some embodiments.

In the structure shown in FIG. 6, the image capturing and display apparatus 100 is constituted by two substrates 600 and 650 that are stacked on each other. Alternatively, the constituent elements shown in FIG. 6 may be formed using a single semiconductor substrate through a series of processes. In this case, a penetrating electrode that connects a portion of the conductive pattern 656 and a portion of the conductive pattern 607 to each other is formed.

In FIG. 6, the photoelectric conversion element 201, the floating diffusion FD, the reset transistor 204, and the transfer transistor 206 are formed in the substrate 600, and the amplifier transistor 202, the reset transistor 205, and the light-emitting element 203 are formed in the substrate 650. Alternatively, the floating diffusion FD, the reset transistor 204, and the transfer transistor 206 may be formed in the substrate 650. With this arrangement, it is possible to increase the area of the impurity region 602 in the photoelectric conversion element 201 formed in the substrate 600.

In the structure shown in FIG. 6, the photoelectric conversion element 201 receives incident light from the lower side of the image capturing and display apparatus 100, and the light-emitting element 203 emits light toward the upper side of the image capturing and display apparatus 100. Therefore, the photoelectric conversion element 201 and the light-emitting element 203 have a positional relationship in which they do not interfere with each other. In this way, the photoelectric conversion element 201 and the light-emitting element 203 are disposed on different surfaces, and thus light from the light-emitting element 203 and light from the outside can be separated from each other at the photoelectric conversion element 201, and a large number of pixels can be disposed in the pixel region 111.

Figure 7A:
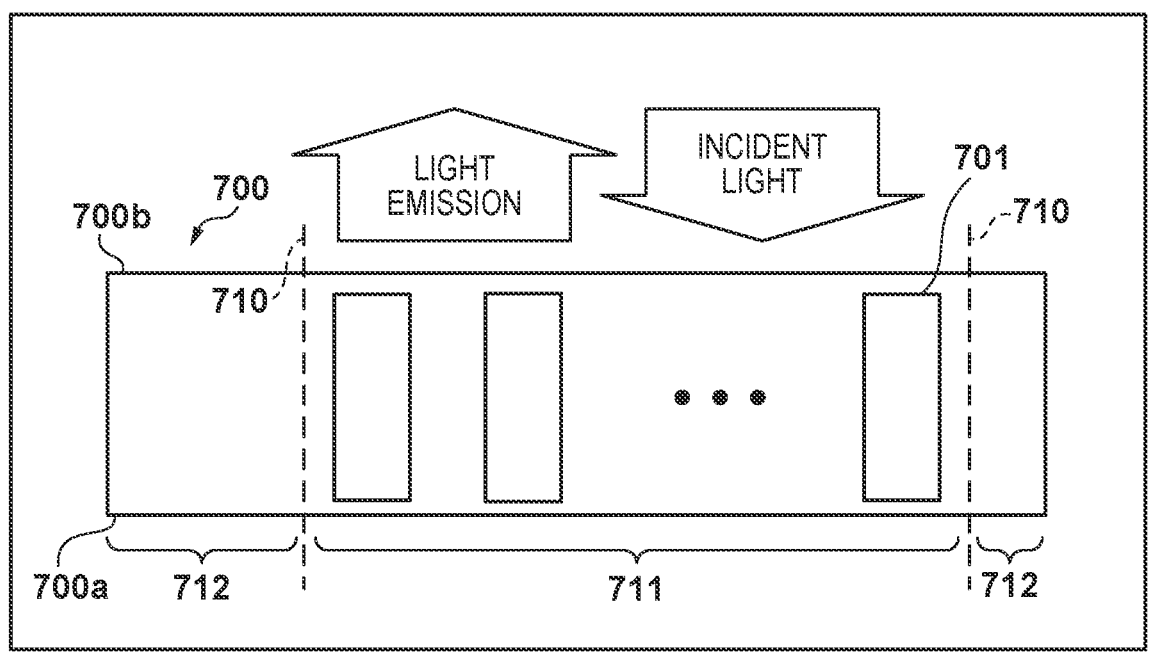
FIG. 7A illustrates an image capturing and display apparatus according to some embodiments.

Next, an example of a configuration of an image capturing and display apparatus 700 according to some embodiments will be described with reference to FIGS. 7A and 7B. FIG. 7A is a cross-sectional view of the image capturing and display apparatus 700. A plan view of the image capturing and display apparatus 700 may be similar to the plan view of the image capturing and display apparatus 100 shown in FIG. 1A, and therefore it is omitted. The image capturing and display apparatus 700 has a pixel region 711 inside a dotted line 710 and a peripheral circuit region 712 outside the dotted line 710. A plurality of pixels 701 are disposed in an array in the pixel region 711. A vertical scanning circuit 102 is disposed in the peripheral circuit region 712. In addition, a power supply circuit (not shown) and so on are also disposed in the peripheral circuit region 712. Conductive lines 103 are each disposed for a plurality of pixels that are lined up in a row direction. The pixels 701 are supplied with control signals from the vertical scanning circuit 102 via the conductive lines 103. The image capturing and display apparatus 700 has an upper surface 700b and a lower surface 700a that is opposite the upper surface 700b. Each pixel 701 emits, from the upper surface 700b of the image capturing and display apparatus 700, light of an intensity corresponding to the intensity of incident light entering through the upper surface 700b of the image capturing and display apparatus 700. Therefore, the upper surface 700b may also be referred to as an incidence surface and a light-emitting surface.

Figure 7B:
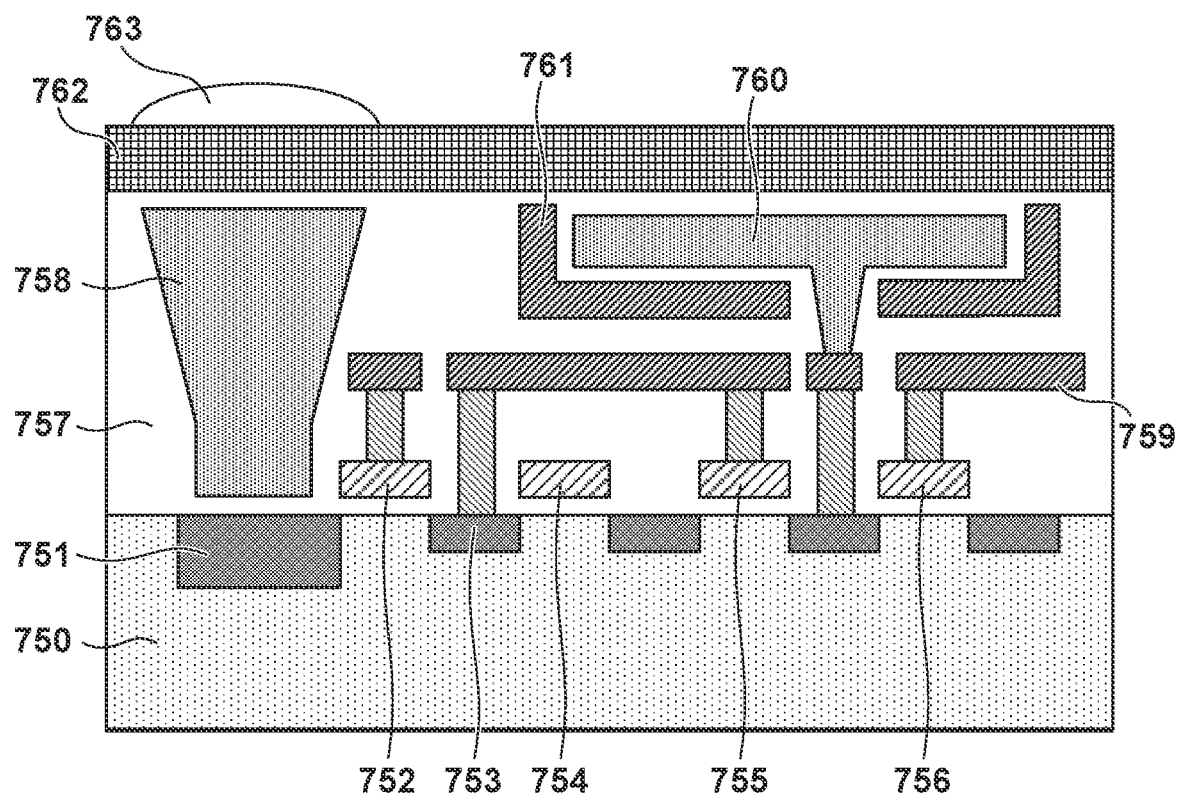
FIG. 7B illustrates an image capturing and display apparatus according to some embodiments.

FIG. 7B shows a cross-sectional view that focuses on one pixel 701. An equivalent circuit diagram for the pixel 701 may be similar to the equivalent circuit diagram for the pixel 101. FIG. 7B illustrates a case in which the pixel 701 is the pixel 101b shown in FIG. 2B. The image capturing and display apparatus 700 may be formed using a single substrate. The image capturing and display apparatus 700 includes a semiconductor layer 750, an insulation layer 757, a color filter layer 762, and a microlens 763. The semiconductor layer 750 includes a plurality of impurity regions, including impurity regions 751 and 753. The impurity region 751 constitutes the photoelectric conversion element 201. The impurity region 753 functions as the floating diffusion FD. In addition, the plurality of impurity regions also include regions that constitute the reset transistors 204 and 205 and the amplifier transistor 202. By including a color filter for the photoelectric conversion element and a color filter for the light-emitting element in the same color filter layer 762, it is possible to reduce the influence of variations in the thickness of the filters, and improve image quality.

Electrodes 752, 754, 755, and 756, a conductive pattern 759, a light-shielding portion 761, a light waveguide 758, and a light-emitting layer 760 are formed in the insulation layer 757. The electrode 752 functions as the gate of the transfer transistor 206. The electrode 754 functions as the gate of the reset transistor 204. The electrode 755 functions as the gate of the amplifier transistor 202. The electrode 756 functions as the gate of the reset transistor 205. The light-emitting layer 760 constitutes the light-emitting element 203. The light-shielding portion 761 is located between the light-emitting layer 760 and the impurity region 751, and prevents light emitted from the light-emitting layer 760 from reaching the impurity region 751. The light-shielding portion 761 is formed using metal or a polarizing member, for example. The light waveguide 758 collects incident light entering the insulation layer 757 via the microlens 763, to the impurity region 751. The color filter layer 762, the microlens 763, the light waveguide 758, and so on may be omitted.

As described above, the photoelectric conversion element 201 performs photoelectric conversion on incident light entering through the upper surface 700b of the image capturing and display apparatus 700. That is, the substrate of the image capturing and display apparatus 700 is a top side illumination type substrate. Alternatively, the substrate of the image capturing and display apparatus 700 may be formed as a back side illumination type substrate.

Figure 8A:
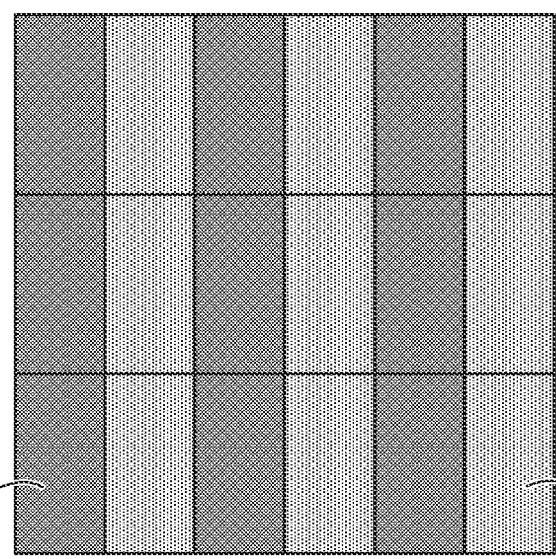
FIG. 8A illustrates a planar layout of a pixel array according to some embodiments.
Figure 8B:
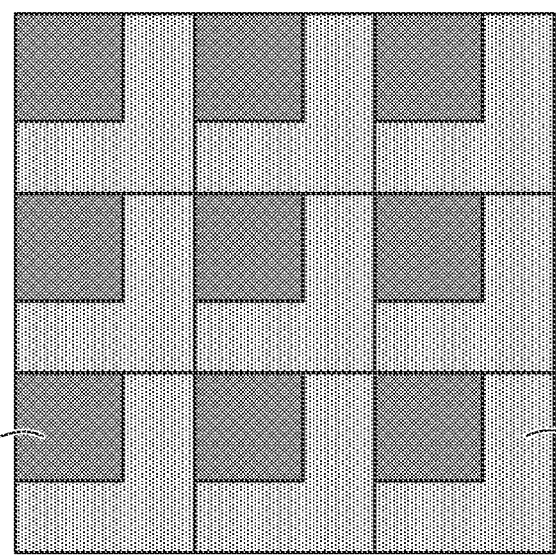
FIG. 8B illustrates a planar layout of a pixel array according to some embodiments.
Figure 8C:
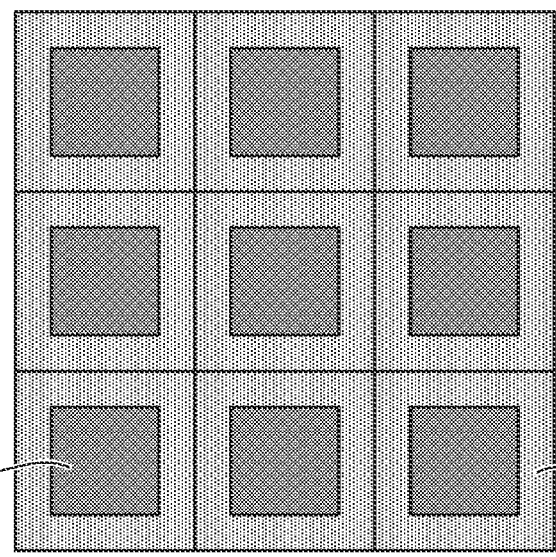
FIG. 8C illustrates a planar layout of a pixel array according to some embodiments.

FIGS. 8A to 8C illustrate specific examples of planar layouts of impurity regions 751 and light-emitting layers 760. FIGS. 8A to 8C each show the positions of impurity regions 751 and light-emitting layers 760 in the upper surface 700b of the image capturing and display apparatus 700 in plan view, and focus on nine pixels 701 arranged in tree rows and three columns.

In the layout shown in FIG. 8A, rectangular impurity regions 751 and rectangular light-emitting layers 760 are arranged. In the layout shown in FIG. 8B, rectangular (e.g. square) impurity regions 751 and L-shaped light-emitting layers 760 are arranged. In the layout shown in FIG. 8C, frame-shaped light-emitting layers 760 are respectively positioned around rectangular (e.g. square) impurity regions 751. In this way, in any of the layouts, the impurity regions 751 and the light-emitting layers 760 do not overlap each other in plan view of the upper surface 700b of the image capturing and display apparatus 700.

In the above-described image capturing and display apparatus 100, the impurity regions 602 that constitute the photoelectric conversion elements 201 and the light-emitting layers 657 that constitute the light-emitting elements 203 may be disposed so as not to overlap each other in plan view of the upper surface 100b of the image capturing and display apparatus 100. A long-wavelength component of incident light to the impurity region 602 easily passes through a silicon layer. Such an arrangement makes it possible to prevent light passing through the impurity region 602 from having an influence on the light-emitting layer 760.

Figure 9:
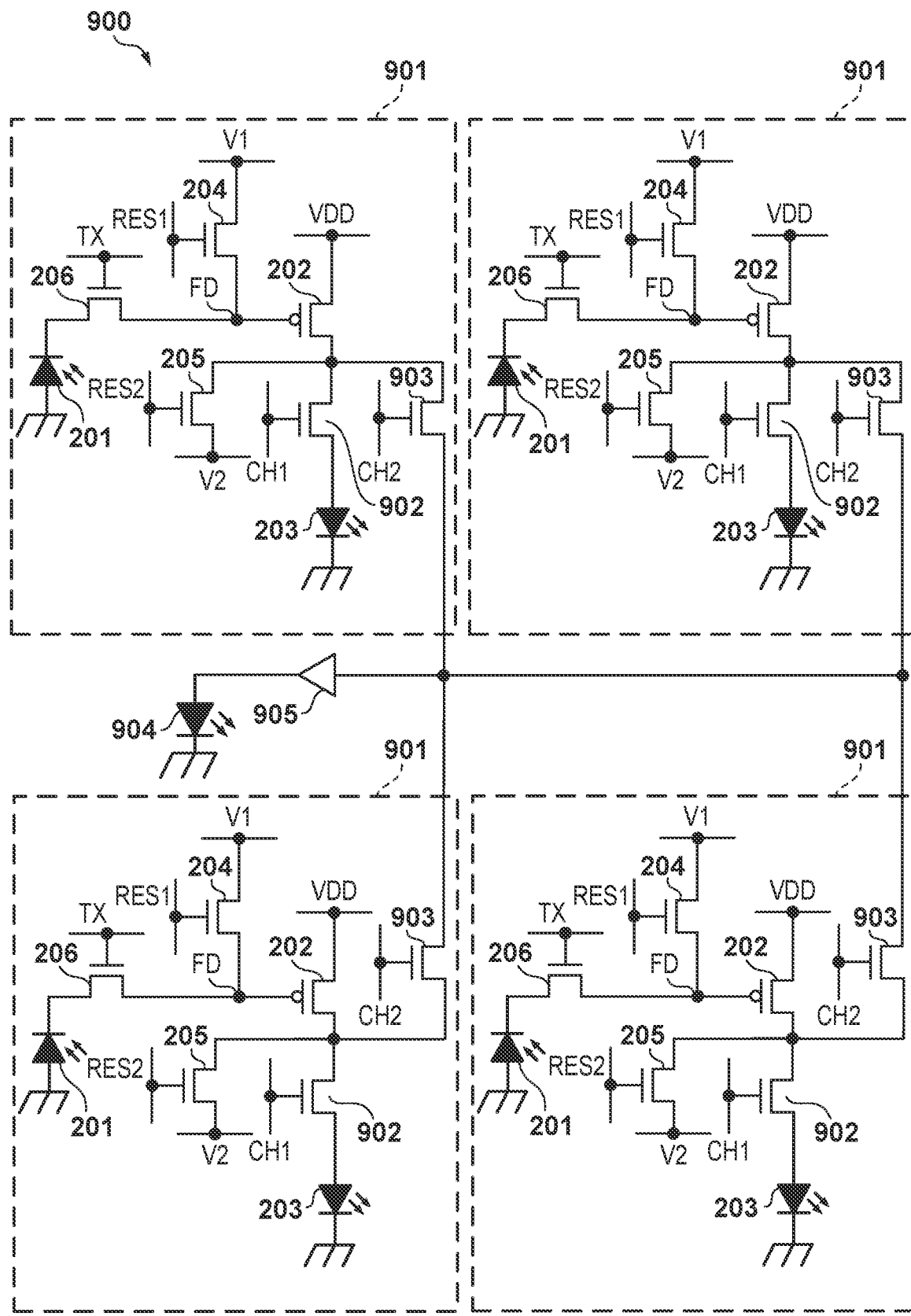
FIG. 9 is an equivalent circuit diagram for a pixel according to some embodiments.

Next, an example of a configuration of an image capturing and display apparatus 900 according to some embodiments will be described with reference to FIG. 9. A plan view and a cross-sectional view of the image capturing and display apparatus 900 may be similar to the plan view and the cross-sectional view of the image capturing and display apparatus 100 shown in FIG. 1A, and therefore they are omitted. FIG. 9 is an equivalent circuit diagram for four pixels arranged in two rows and two columns. A plurality of pixels 901 are disposed in an array in the pixel region of the image capturing and display apparatus 900. The pixels 901 are different from the pixels 101 of the image capturing and display apparatus 100 in that the pixels 901 each include a switch transistor 902 and a switch transistor 903. Furthermore, in the pixel region, a light-emitting element 904 and a buffer circuit 905 are disposed for every four pixels 901 that are arranged in two rows and two columns. In this way, the image capturing and display apparatus 900 includes, in the pixel region, light-emitting elements 203 that are disposed at the same pitch as the photoelectric conversion element 201, and light-emitting elements 904 that are disposed at a pitch different from the aforementioned pitch. In FIG. 9, a light-emitting element 904 and a buffer circuit 905 are disposed for every four pixels 901. However, they may be disposed for every set of pixels 901 that includes another number of pixels 901. FIG. 9 illustrates points that differ from the pixel 101b shown in FIG. 2B. However, such differences may be applied to other pixels shown in FIGS. 2A to 4B.

The switch transistor 902 is connected between the amplifier transistor 202 and the light-emitting element 203. The gate of the switch transistor 902 is supplied with a control signal CH1 from the vertical scanning circuit 102. The switch transistor 903 is connected between the amplifier transistor 202 and the buffer circuit 905. The gate of the switch transistor 903 is supplied with a control signal CH2 from the vertical scanning circuit 102. The light-emitting element 904 is connected between the buffer circuit 905 and ground. The configuration and the functions of the buffer circuit 905 may be similar to those of the buffer circuit 207. The configurations and the functions of the light-emitting element 904 may be similar to those of the light-emitting element 203. The light-emitting element 904 may produce colors using the same method as the light-emitting element 203, or a different method. For example, the light-emitting element 203 may emit light of each color using a color filter, and the light-emitting element 904 may emit light of each color by itself.

The image capturing and display apparatus 900 can operate in two modes, namely a high-resolution mode and a low-resolution mode. In the high-resolution mode, the vertical scanning circuit 102 sets the control signal CH1 to the high level to turn ON the switch transistor 902 of each pixel 901, and sets the control signal CH2 to the low level to turn OFF the switch transistor 903 of each pixel 901. In this case, signals acquired by the photoelectric conversion elements 201 of the pixels 901 are supplied to the light-emitting elements 203, and the light-emitting elements 203 emit light. On the other hand, no signals are supplied to the light-emitting elements 904, and therefore the light-emitting elements 904 do not emit light. In this way, in the high-resolution mode, one light-emitting element 203 emits light for each pixel 901.

In the low-resolution mode, the vertical scanning circuit 102 sets the control signal CH1 to the low level to turn OFF the switch transistor 902 of each pixel 901, and sets the control signal CH2 to the high level to turn ON the switch transistor 903 of each pixel 901. In this case, signals acquired by the respective photoelectric conversion elements 201 of four pixels 901 are integrated into one, and are thus supplied to the light-emitting element 904, and the light-emitting element 904 emits light. On the other hand, no signals are supplied to the light-emitting elements 203, and therefore the light-emitting elements 203 do not emit light. In this way, in the low-resolution mode, one light-emitting element 904 emits light for every four pixels 901. In this way, the switch transistors 902 and 903 function as switch elements that switch the transmission destination of signals acquired by one photoelectric conversion element 201 to a light-emitting element 203 or the light-emitting element 904.

The image capturing and display apparatus 900 may further be configured to cause pixels 901 included in a portion of the pixel region to operate in the low-resolution mode, and pixels 901 included in another region to operate in the high-resolution mode. Specifically, the image capturing and display apparatus 900 may be configured to set the control signal CH2 for pixels 901 included in the region that is desired to operate in the low-resolution mode to the high level, and set the control signal CH1 for pixels 901 included in the region that is desired to operate in the high-resolution mode to the high level.

Figure 10:
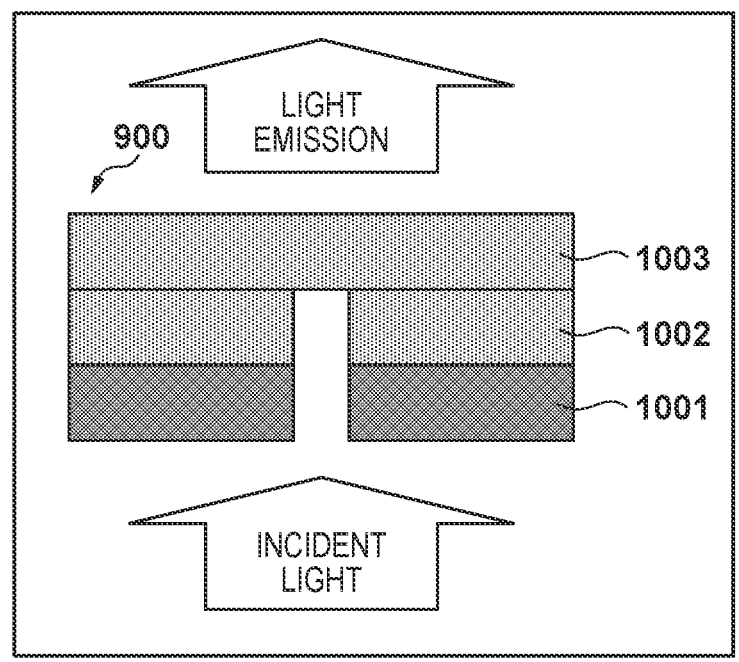
FIG. 10 illustrates a cross-sectional structure of a pixel according to some embodiments.

FIG. 10 is a cross-sectional view focusing on a portion of the pixel region of the image capturing and display apparatus 900. An impurity region 1001 constitutes the photoelectric conversion element 201. A light-emitting layer 1002 constitutes the light-emitting element 203. A light-emitting layer 1003 constitutes the light-emitting element 904. The impurity region 1001 performs photoelectric conversion on incident light entering through the lower surface of the image capturing and display apparatus 900, and the light-emitting layer 1002 and the light-emitting layer 1003 each emit light toward the upper surface of the image capturing and display apparatus 900. The light-emitting layer 1003 is disposed over four pixels that are arranged in two rows and two columns.

Figure 11:
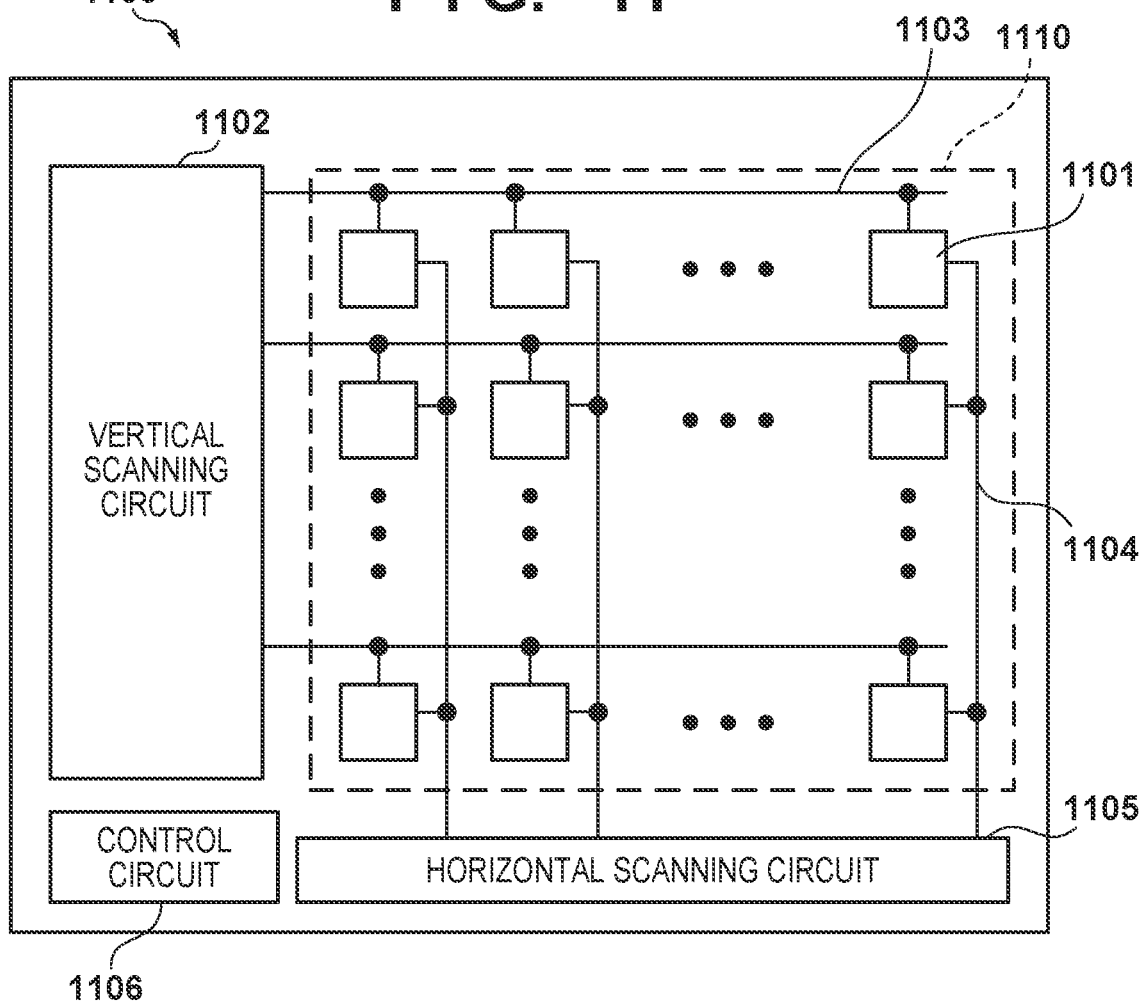
FIG. 11 illustrates an image capturing and display apparatus according to some embodiments.

An example of a configuration of an image capturing and display apparatus 1100 according to some embodiments will be described with reference to FIG. 11. FIG. 11 is a plan view of the image capturing and display apparatus 1100. A cross-sectional view of the image capturing and display apparatus 1100 is similar to the cross-sectional view of the image capturing and display apparatus 100 shown in FIG. 1B, and therefore it is omitted. The image capturing and display apparatus 1100 has a pixel region inside a dotted line 1110 and a peripheral circuit region outside the dotted line 1110. A plurality of pixels 1101 are disposed in an array in the pixel region. A vertical scanning circuit 1102, a horizontal scanning circuit 1105, and a control circuit 1106 are disposed in the peripheral circuit region. In addition, a power supply circuit (not shown) and so on are also disposed in the peripheral circuit region. Conductive lines 1103 are each disposed for a plurality of pixels that are lined up in a row direction. The pixels 1101 are supplied with control signals from the vertical scanning circuit 1102 via the conductive lines 1103. In FIG. 11, one conductive line 1103 is shown for each row of pixels. However, if each pixel is to be supplied with a plurality of kinds of control signals, a plurality of conductive lines 1103 are respectively disposed for the control signals. Conductive lines 1104 are each disposed for a plurality of pixels that are lined up in a column direction. Signals are read out from the pixels 1101 to the horizontal scanning circuit 1105 via the conductive lines 1104. The control circuit 1106 controls operations of the vertical scanning circuit 1102 based on signals read out to the horizontal scanning circuit 1105.

Figure 12A:
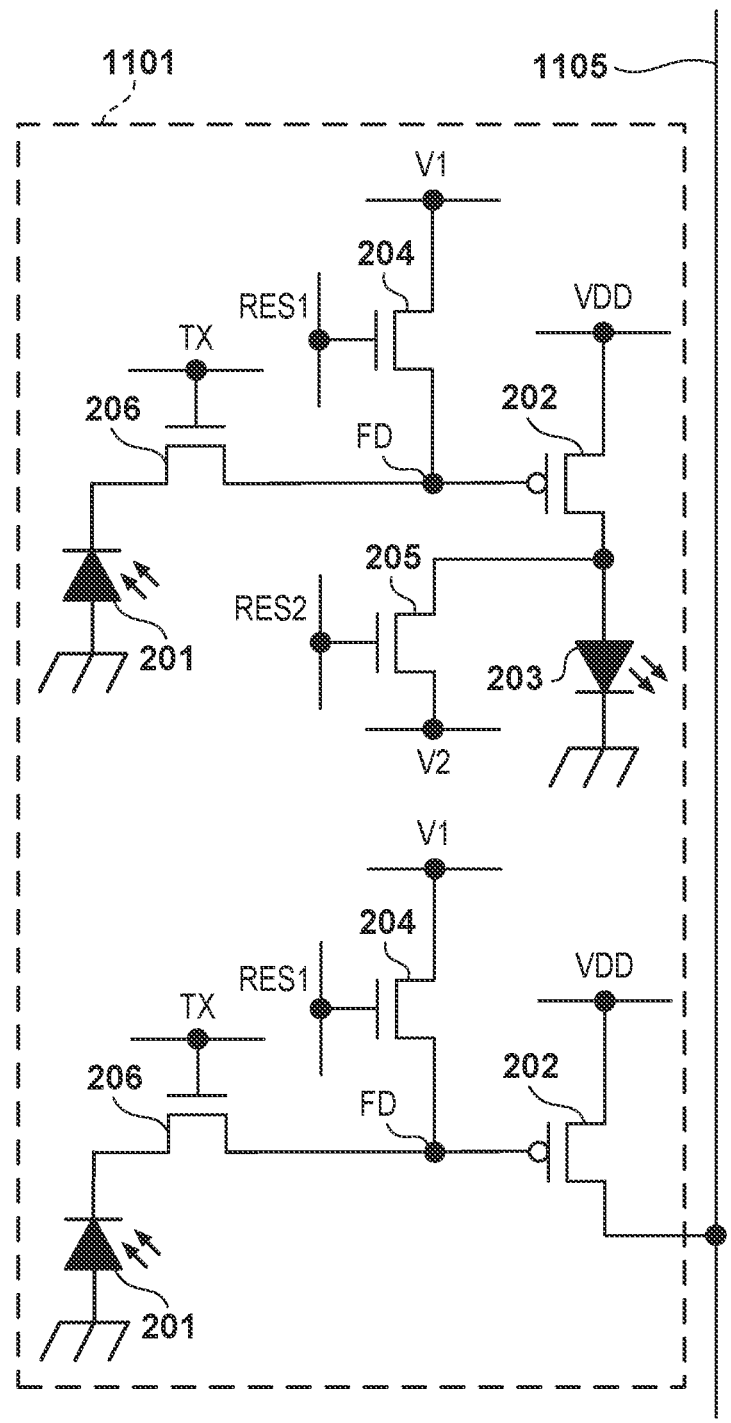
FIG. 12A illustrates an image capturing and display apparatus according to some embodiments.

A specific example of the configuration of a pixel 1101 will be described with reference to the equivalent circuit diagram shown in FIG. 12A. The pixels 1101 includes two sets that each include the photoelectric conversion element 201, the amplifier transistor 202, the reset transistor 204, and the transfer transistor 206 of the pixel 101*b* shown in FIG. 2B. One primary electrode of the amplifier transistor 202 in one set is connected to the reset transistor 205 and the light-emitting element 203 as in the pixel 101*b*. One primary electrode of the amplifier transistor 202 in the other set is connected to the conductive lines 1104. Although FIG. 12A illustrates a configuration based on the example shown in FIG. 2B, each set may have a configuration of the specific example of any of the other pixels shown in FIGS. 2A to 4B.

In the image capturing and display apparatus 1100, the light-emitting element 203 emits light corresponding to an electrical charge signal acquired by one photoelectric conversion element 201, while the horizontal scanning circuit 1105 reads out a signal acquired by the other photoelectric conversion element 201. The control circuit 1106 may generate image data from signals read out by the horizontal scanning circuit 1105, and store the image data. One photoelectric conversion element 201 may detect visible light, and the other photoelectric conversion element 201 may detect infrared light.

Figure 12B:
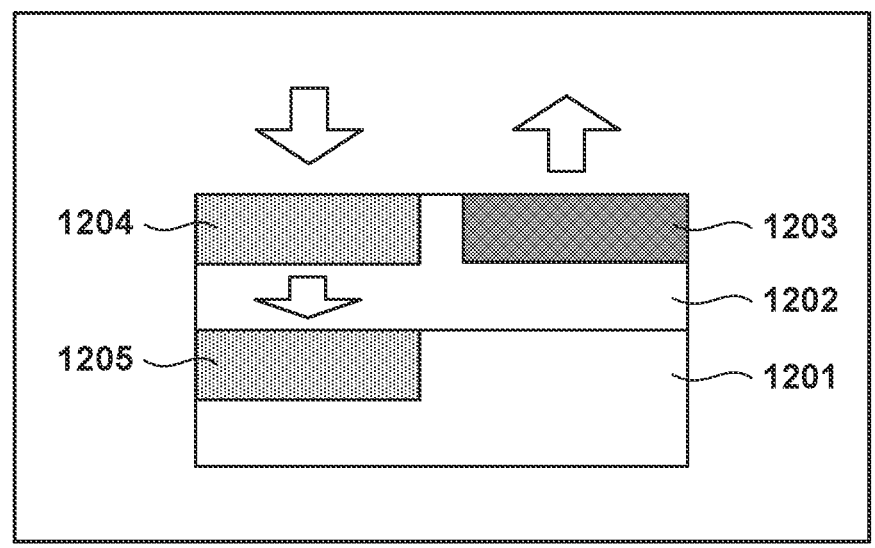
FIG. 12B illustrates an image capturing and display apparatus according to some embodiments.
Figure 12C:
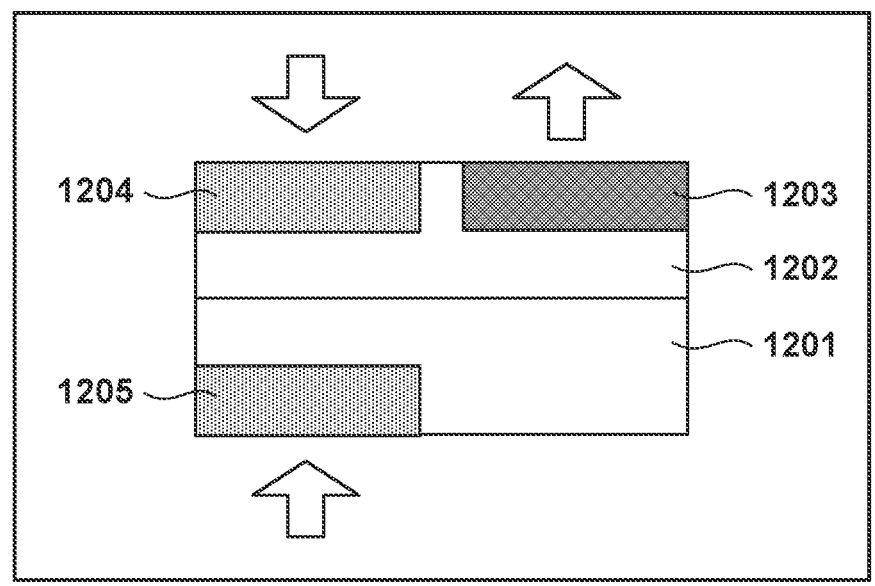
FIG. 12C illustrates an image capturing and display apparatus according to some embodiments.

FIGS. 12B and 12C are cross-sectional views each focusing on one pixel 1101 of the image capturing and display apparatus 1100. The image capturing and display apparatus 1100 includes two substrates 1201 and 1202 that are stacked on each other. Each substrate may be a top side illumination type substrate or a back side illumination type substrate. The substrate 1201 includes an impurity region 1205 that constitutes a photoelectric conversion element. The substrate 1202 includes an impurity region 1204 that constitutes a photoelectric conversion element, and a light-emitting layer 1203 that constitutes a light-emitting element. The impurity region 1204 and the impurity region 1205 may respectively constitute the upper photoelectric conversion element 201 and the lower photoelectric conversion element 201 shown in FIG. 12A, or the other way around.

In the embodiment shown in FIG. 12B, both the impurity regions 1204 and 1205 perform photoelectric conversion on incident light from the upper side of the image capturing and display apparatus 1100, and the light-emitting layer 1203 emits light toward the upper side of the image capturing and display apparatus 1100. In the embodiment shown in FIG. 12C, the impurity region 1204 performs photoelectric conversion on incident light from the upper side of the image capturing and display apparatus 1100, the impurity region 1205 performs photoelectric conversion on incident light from the lower side of the image capturing and display apparatus 1100, and the light-emitting layer 1203 emits light toward the upper side of the image capturing and display apparatus 1100.

In the example shown in FIG. 12C, the impurity region 1204 constitutes the lower photoelectric conversion element 201. When the image capturing and display apparatus 1100 is mounted on a wearable device such as a pair of glasses, the upper surface of the image capturing and display apparatus 1100 is located so as to face the eyes of the user. Therefore, the control circuit 1106 may perform gaze detection using image data acquired by the lower photoelectric conversion element 201. Using components of the image capturing and display apparatus 900, the control circuit 1106 may display a region where the user's gaze is detected in the pixel region of the image capturing and display apparatus 1100 at high resolution, and display the other region at low resolution. Also, the impurity region 1205 may be formed in a large portion of the substrate 1201 (e.g. 80% or more of the surface of the substrate in plan view). Also, the light-emitting layer 1203 may be formed in the substrate 1201 and the substrate 1202 may be removed where appropriate.

In the above-described various embodiments, a photoelectric conversion element 201 and a light-emitting element 203 correspond one to one to each other. Alternatively, two or more photoelectric conversion elements 201 and one light-emitting element 203 may correspond to each other. Specifically, light of an intensity that is based on the sum of electrical charge signals acquired by two or more photoelectric conversion elements 201 may be emitted by one light-emitting element 203. Furthermore, one photoelectric conversion element 201 and two or more light-emitting element 203 may correspond to each other. Specifically, light of an intensity that is based on an electrical charge signal acquired by one photoelectric conversion element 201 may be separately emitted by two or more light-emitting elements 203. Furthermore, the correspondence between photoelectric conversion element(s) 201 and light-emitting element(s) 203 may be a mix of the above. For example, an electrical charge signal acquired by one photoelectric conversion element 201 that detects blue light may be separately supplied to two or more light-emitting elements 203 that emit blue light. Furthermore, in the same image capturing and display apparatus, electrical charge signals acquired by two or more photoelectric conversion elements 201 that detect green light may be integrated into one and supplied to one light-emitting element 203 that emits green light. Such configurations realize light-reception and light-emission by an optimum array for each color.

Application examples of image capturing and display apparatuses according to the above-described embodiments will be described with reference to FIGS. 13A to 13C. The image capturing and display apparatuses can be applied to a wearable device such as smart glasses, an HMD, or smart contact lenses. An image capturing and display apparatus that can be used in such an application example includes a photoelectric conversion element that can perform photoelectric conversion on visible light, and a light-emitting element that can emit visible light.

Figure 13A:
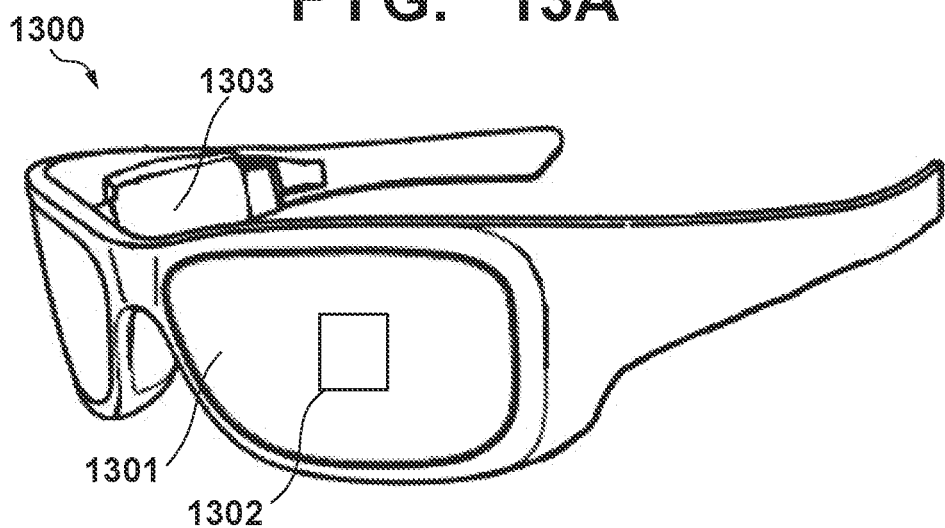
FIG. 13A illustrates an application example of an image capturing and display apparatus according to some embodiments.

FIG. 13A illustrates a pair of glasses 1300 (smart glasses) according to one application example. An image capturing and display apparatus 1302 is mounted on a lens 1301 of the pair of glasses 1300. The image capturing and display apparatus 1302 may be the above-described image capturing and display apparatus 100, for example. The pair of glasses 1300 also includes a control apparatus 1303. The control apparatus 1303 functions as a power supply that supplies power to the image capturing and display apparatus 1302, and also controls operations of the image capturing and display apparatus 1302. An optical system for collecting light onto the image capturing and display apparatus 1302 is formed in the lens 1301.

Figure 13B:
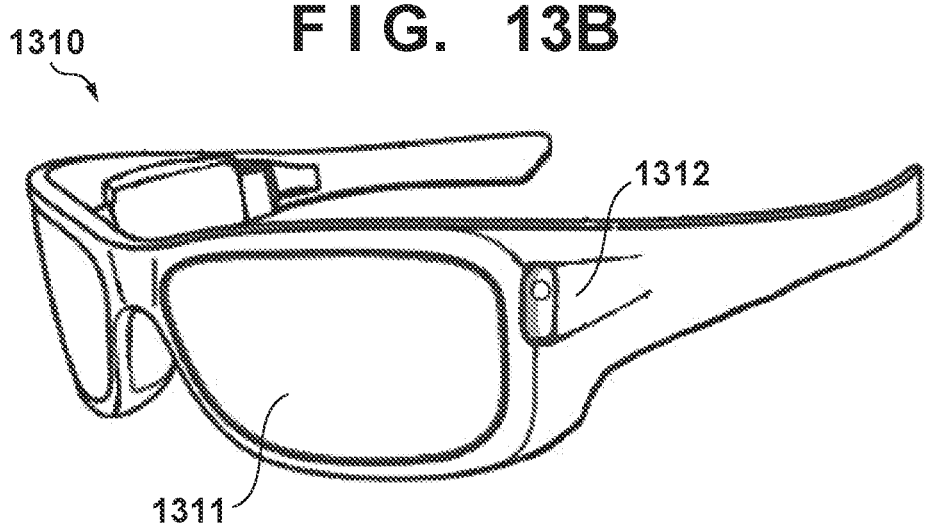
FIG. 13B illustrates an application example of an image capturing and display apparatus according to some embodiments.

FIG. 13B illustrates a pair of glasses 1310 (smart glasses) according to one application example. The pair of glasses 1310 includes a control apparatus 1312, and an image capturing and display apparatus is mounted in the control apparatus 1312. This image capturing and display apparatus may be the above-described image capturing and display apparatus 100, for example. An optical system for projecting light emitted from the image capturing and display apparatus in the control apparatus 1312 is formed in a lens 1311. The optical system projects an image onto the lens 1311 upon receiving this light. The control apparatus 1312 functions as a power supply that supplies power to the image capturing and display apparatus, and also controls operations of the image capturing and display apparatus.

Figure 13C:
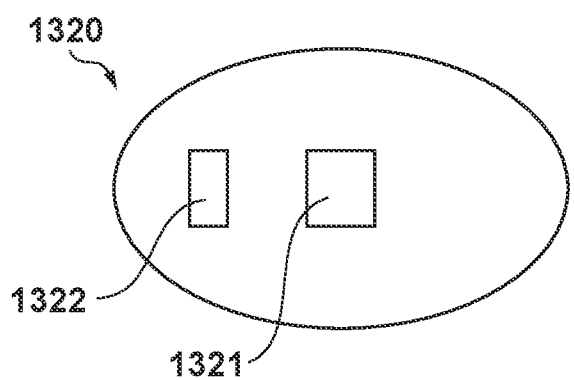
FIG. 13C illustrates an application example of an image capturing and display apparatus according to some embodiments.

FIG. 13C illustrates a contact lens 1320 (a smart contact lens) according to one application example. An image capturing and display apparatus 1321 is mounted on a contact lens 1320. The image capturing and display apparatus 1321 may be the above-described image capturing and display apparatus 100, for example. The contact lens 1320 also includes a control apparatus 1322. The control apparatus 1322 functions as a power supply that supplies power to the image capturing and display apparatus 1321, and also controls operations of the image capturing and display apparatus 1321. An optical system for collecting light onto the image capturing and display apparatus 1321 is formed in the contact lens 1320.

The image capturing and display apparatuses are also applicable to a night vision apparatus, a monitoring apparatus, binoculars, a telescope, a medical detector, and so on. An image capturing and display apparatus that can be used in such an application example includes a photoelectric conversion element that can perform photoelectric conversion on visible light and light other than visible light (ultraviolet light, infrared light, and so on), and a light-emitting element that can emit visible light. In such an application example, light that cannot be easily perceived by human eyes is displayed as visible light.

The image capturing and display apparatuses are also applicable to monitoring and a security apparatus. An image capturing and display apparatus that can be used in such an application example includes a photoelectric conversion element that can perform photoelectric conversion on visible light, and a light-emitting element that can emit light other than visible light (ultraviolet light, infrared light, and so on). With such an application example, information regarding a subject can be made invisible.

In a device according to any of the application examples, the period of time from light reception to light emission is short in the image capturing and display apparatuses according to the embodiments. Therefore, the user can use the device without feeling that something is amiss. The above-described embodiments make it easier to apply the image capturing and display apparatus to another apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image capturing and display apparatus comprising:
   a first substrate including a plurality of photoelectric conversion elements for converting incident light from the outside of the image capturing and display apparatus to electrical charge signals, and a first connective portion; and
   a second substrate including a plurality of light-emitting elements for emitting light of an intensity corresponding to the electrical charge signals acquired by the plurality of photoelectric conversion elements, and a second connective portion,
   wherein signal paths for transmitting signals from the plurality of photoelectric conversion elements to the plurality of light-emitting elements comprise the first connective portion and the second connective portion, and
   wherein the first connective portion and the second connective portion are directly connected to each other, or are connected via a micro bump.

2. The image capturing and display apparatus according to claim 1, further comprising a light-shielding portion that is located between the light-emitting elements and the photoelectric conversion elements.

3. The image capturing and display apparatus according to claim 1, comprising amplifier circuits for amplifying electrical charge signals acquired by the photoelectric conversion elements.

4. The image capturing and display apparatus according to claim 3, further comprising buffer circuits that are connected between the amplifier circuits and the light-emitting elements.

5. The image capturing and display apparatus according to claim 1, further comprising:
   floating diffusions; and
   transfer transistors that are located between the photoelectric conversion elements and the floating diffusions,
   wherein the image capturing and display apparatus further comprises a driving circuit for generating control signals that switch the transfer transistors to ON and OFF.

6. The image capturing and display apparatus according to claim 5, wherein
   the image capturing and display apparatus further comprises capacitor elements that are connected between the floating diffusions and the light-emitting elements.

7. The image capturing and display apparatus according to claim 5, wherein the driving circuit switches the transfer transistors connected to the plurality of photoelectric conversion elements to ON or OFF at the same time.

8. The image capturing and display apparatus according claim 1, wherein
   a pixel region is defined as a region in which the plurality of photoelectric conversion elements are arranged in an array,
   the plurality of light-emitting elements include:
      a plurality of first light-emitting elements that are arranged in the pixel region at a first pitch; and
      a plurality of second light-emitting elements that are arranged in the pixel region at a second pitch that is different from the first pitch, and
   the image capturing and display apparatus further comprises a switch element for switching the transmission destination of a signal acquired by one photoelectric conversion element to a first light-emitting element and a second light-emitting element.

9. The image capturing and display apparatus according claim 1, further comprising:
   first reset transistors for resetting voltages across the photoelectric conversion elements, and second reset transistors for resetting voltages across the light-emitting elements.

10. The image capturing and display apparatus according to claim 9, wherein gates of the first reset transistors and the gates of the second reset transistors are supplied with control signals via the same conductive lines.

11. The image capturing and display apparatus according to claim 1, wherein
    two or more light-emitting elements emit light of an intensity corresponding to an electrical charge signal acquired by one photoelectric conversion element of the plurality of photoelectric conversion elements, and
    one light-emitting element emits light of an intensity corresponding to electrical charge signals acquired by two or more photoelectric conversion elements of the plurality of photoelectric conversion elements.

12. The image capturing and display apparatus according to claim 1, wherein
    the image capturing and display apparatus comprises a first substrate and a second substrate that are stacked on each other,
    the photoelectric conversion elements are included in the first substrate, and
    the light-emitting elements are included in the second substrate.

13. The image capturing and display apparatus according to claim 1, wherein the light-emitting elements are organic LEDs or inorganic LEDs.

14. The image capturing and display apparatus according to claim 1, wherein the photoelectric conversion elements are included in a back side illumination type substrate.

15. The image capturing and display apparatus according to claim 1, wherein
    the image capturing and display apparatus has a first surface,
    the photoelectric conversion elements convert incident light entering through the first surface, to electrical charge signals, and
    the light-emitting elements emit light from the first surface.

16. The image capturing and display apparatus according to claim 1, wherein
    the image capturing and display apparatus has a first surface and a second surface that is opposite the first surface,
    the photoelectric conversion elements convert incident light entering through the first surface, to electrical charge signals, and
    the light-emitting elements emit light from the second surface.

17. A wearable device comprising:
    the image capturing and display apparatus according to claim 1; and
    a power supply for supplying power to the image capturing and display apparatus.

18. The image capturing and display apparatus according to claim 1, wherein
    the first substrate comprises a first semiconductor layer including a first transistor and a first conductive pattern, and
    the second substrate comprises a second semiconductor layer including a second transistor and a second conductive pattern.

19. The image capturing and display apparatus according to claim 1, wherein the first substrate and the second substrate are stacked on each other, and the first connective portion and the second connective portion are directly connected to each other.

20. The image capturing and display apparatus according to claim 19,
wherein the first connective portion is arranged in a first insulating layer, and the second connective portion is arranged in a second insulating layer.

21. The image capturing and display apparatus according to claim 20, wherein the first insulating layer directly contacts with the second insulating layer.

22. A wearable device comprising:
the image capturing and display apparatus according to claim 21; and
a power supply for supplying power to the image capturing and display apparatus.

23. An image capturing and display apparatus comprising:
a plurality of photoelectric conversion elements for converting incident light from the outside of the image capturing and display apparatus to electrical charge signals; and
a plurality of light-emitting elements for emitting light of an intensity corresponding to the electrical charge signals acquired by the plurality of photoelectric conversion elements,
wherein a pixel region is defined as a region in which the plurality of photoelectric conversion elements are arranged in an array,
signal paths for transmitting signals from the plurality of photoelectric conversion elements to the plurality of light-emitting elements lie within the pixel region,
the plurality of light-emitting elements include:
a plurality of first light-emitting elements that are arranged in the pixel region at a first pitch; and
a plurality of second light-emitting elements that are arranged in the pixel region at a second pitch that is different from the first pitch, and
the image capturing and display apparatus further comprises a switch element for switching the transmission destination of a signal acquired by one photoelectric conversion element to a first light-emitting element and a second light-emitting element.

24. An image capturing and display apparatus comprising:
a plurality of photoelectric conversion elements for converting incident light from the outside of the image capturing and display apparatus to electrical charge signals; and
a plurality of light-emitting elements for emitting light of an intensity corresponding to the electrical charge signals acquired by the plurality of photoelectric conversion elements,
wherein a pixel region is defined as a region in which the plurality of photoelectric conversion elements are arranged in an array,
signal paths for transmitting signals from the plurality of photoelectric conversion elements to the plurality of light-emitting elements lie within the pixel region,
two or more light-emitting elements emit light of an intensity corresponding to an electrical charge signal acquired by one photoelectric conversion element of the plurality of photoelectric conversion elements, and
one light-emitting element emits light of an intensity corresponding to electrical charge signals acquired by two or more photoelectric conversion elements of the plurality of photoelectric conversion elements.

* * * * *